(12) United States Patent
Hasegawa et al.

(10) Patent No.: US 7,169,621 B2
(45) Date of Patent: Jan. 30, 2007

(54) FERROELECTRIC MEMORY DEVICE

(75) Inventors: Kazumasa Hasegawa, Fujimi-cho (JP);
Eiji Natori, Chino (JP); Takao Nishikawa, Shiojiri (JP); Koichi Oguchi, Suwa (JP); Tatsuya Shimoda, Nagano-ken (JP)

(73) Assignee: Seiko Epson Corporation, Tokyo (JP)

( * ) Notice: Subject to any disclaimer, the term of this patent is extended or adjusted under 35 U.S.C. 154(b) by 146 days.

(21) Appl. No.: 10/780,572

(22) Filed: Feb. 19, 2004

(65) Prior Publication Data

US 2004/0161887 A1  Aug. 19, 2004

Related U.S. Application Data

(62) Division of application No. 09/934,550, filed on Aug. 23, 2001, now Pat. No. 6,727,536.

(30) Foreign Application Priority Data

Sep. 18, 2000  (JP) .............................. 2000-281725

(51) Int. Cl.
*H01L 21/00* (2006.01)
(52) U.S. Cl. .................... 438/3; 438/257; 257/E21; 257/663
(58) Field of Classification Search .................... 438/3, 438/257, 166, 197, 381, 680, 681, 692, 706, 438/712
See application file for complete search history.

(56) References Cited

U.S. PATENT DOCUMENTS 5,060,191 A * 10/1991 Nagasaki et al. ........... 365/145
5,592,409 A * 1/1997 Nishimura et al. ......... 365/145
6,057,081 A    5/2000 Yunogami et al.
6,104,324 A    8/2000 Kim
6,351,406 B1   2/2002 Johnson et al.
6,670,659 B1 * 12/2003 Gudesen et al. ............. 257/295
6,690,598 B2 *  2/2004 Oguchi et al. ............... 365/145
6,727,536 B2 *  4/2004 Hasegawa et al. ........... 257/295
6,791,863 B2 *  9/2004 Oguchi et al. ............... 365/145
2002/0017667 A1  2/2002 Shimoda et al.
2002/0018357 A1  2/2002 Oguchi et al.

FOREIGN PATENT DOCUMENTS

| JP | 2-154388 A | 6/1990 |
|---|---|---|
| JP | 8-255879 A | 10/1996 |
| JP | 9-091970 A | 4/1997 |
| JP | 9-102587 A | 4/1997 |
| JP | 10-303378 A | 11/1998 |
| JP | A 2000-4001 | 1/2000 |
| WO | WO 99-12170 | 3/1999 |
| WO | WO 99/18578 | 4/1999 |

* cited by examiner

*Primary Examiner*—David Nhu
(74) *Attorney, Agent, or Firm*—Oliff & Berridge, PLC

(57) ABSTRACT

A ferroelectric memory device of the present invention includes a memory cell array in which memory cells are arranged in a matrix having first signal electrodes, second signal electrodes arranged in a direction intersecting the first signal electrodes, and a ferroelectric layer disposed at least in intersection regions between the first signal electrodes and the second signal electrodes, and a peripheral circuit section for selectively writing information into or reading information from the memory cell. The memory cell array and the peripheral circuit section are formed in different layers. The peripheral circuit section is formed in a region outside the memory cell array.

24 Claims, 17 Drawing Sheets

B - B

FIG. 15
FIG. 16
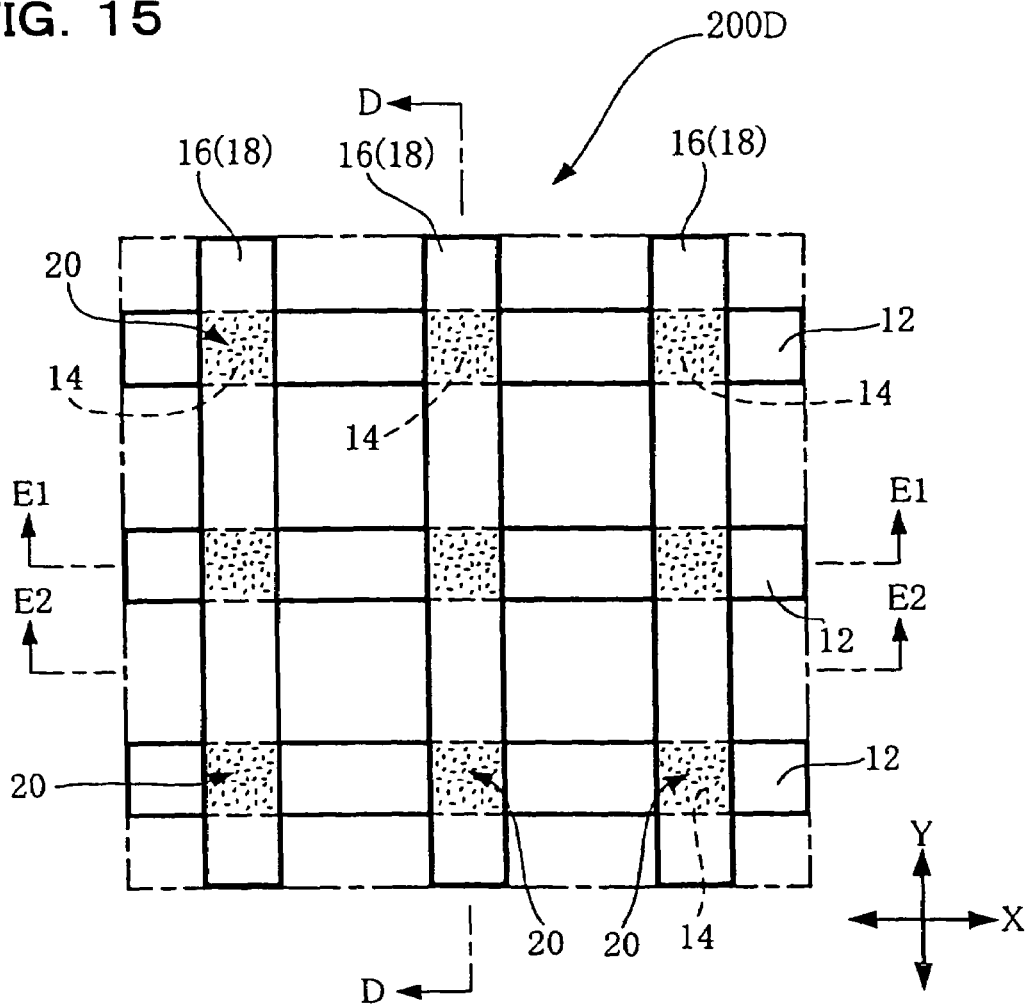
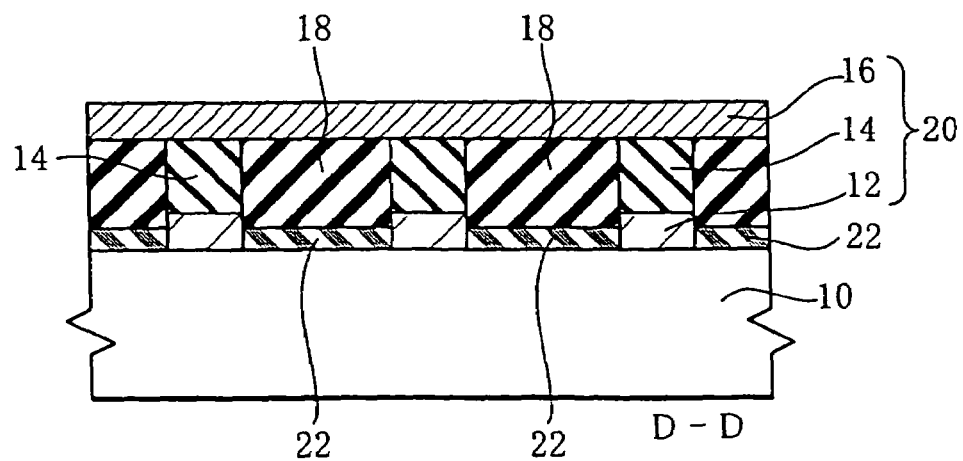

F1-F1

F2-F2

FERROELECTRIC MEMORY DEVICE

This is a Division of application Ser. No. 09/934,550 filed Aug. 23, 2001 now U.S. Pat. No. 6,727,536. The entire disclosure of the prior application is hereby incorporated by reference herein in its entirety.

The present application includes the entire content of Japanese Patent Application No. 2000-281725 filed on Sep. 18, 2000.

FIELD OF THE INVENTION

The present invention relates to a ferroelectric memory device, a method of manufacturing the same, and an embedded device. More particularly, the present invention relates to a simple matrix ferroelectric memory device using only ferroelectric capacitors instead of cell transistors, a method of manufacturing the same, and an embedded device.

BACKGROUND OF ART

A simple matrix memory cell array using only ferroelectric capacitors instead of cell transistors has a very simple structure and enables a higher degree of integration. Therefore, development of such a memory cell array has been expected.

SUMMARY

An objective of the present invention is to provide a ferroelectric memory device including a desired memory cell array, a method of manufacturing the same, and an embedded device.

A ferroelectric memory device according to the present invention comprises:

a memory cell array in which memory cells are arranged in a matrix, the memory cell array including first signal electrodes, second signal electrodes arranged in a direction intersecting the first signal electrodes, and a ferroelectric layer disposed at least in intersection regions between the first signal electrodes and the second signal electrodes; and a peripheral circuit section for selectively writing information into or reading information from the memory cell, wherein the memory cell array and the peripheral circuit section are disposed in different layers, and wherein the peripheral circuit section is formed in a region outside the memory cell array.

In the present invention, the peripheral circuit section is formed in a region outside the memory cell array. Therefore, a semiconductor substrate below the memory cell array is planar. As a result, a planar interlayer dielectric can be easily formed on the semiconductor substrate. Therefore, the memory cell array can be formed reliably on the planar interlayer dielectric, whereby a memory cell array with a desired pattern can be easily formed.

In the present invention, the ferroelectric layer may have any of the following three features.

(1) The ferroelectric layer may be disposed linearly along the first signal electrodes. Specifically, the ferroelectric layer may be selectively disposed over the first signal electrodes. In this case, since the ferroelectric layer is formed linearly along the first signal electrodes, the parasitic capacitance or load capacitance of the second signal electrodes can be decreased.

The memory cells may be disposed over a base, and a dielectric layer may be provided between laminates formed of the first signal electrodes and the ferroelectric layer so as to cover exposed areas of the base.

The dielectric layer may be formed of a material having a dielectric constant lower than a dielectric constant of the ferroelectric layer.

A surface-modifying layer having a surface characteristic differing from a surface characteristic of a surface of the base may be formed over the base.

The surface-modifying layer may be disposed in regions in which the memory cells are not formed and may have a surface exhibiting weaker affinity to a material which forms the memory cells than a surface of the base. The surface-modifying layer may be disposed in regions in which the memory cells are formed and may have a surface exhibiting stronger affinity to a material which forms the memory cells than a surface of the base.

(2) The ferroelectric layer may be disposed linearly along the second signal electrodes. Specifically, the ferroelectric layer may be selectively disposed under the second signal electrodes. In this case, since the ferroelectric layer is formed linearly along the second signal electrodes, the parasitic capacitance or load capacitance of the first signal electrodes can be decreased.

The memory cells may be disposed over a base, and a dielectric layer is provided between laminates formed of the ferroelectric layer and the second signal electrode so as to cover exposed areas of the base and the first signal electrodes.

The dielectric layer may be formed of a material having a dielectric constant lower than a dielectric constant of the ferroelectric layer.

(3) The ferroelectric layer may be disposed only in the intersection regions between the first signal electrodes and the second signal electrodes. In this case, since the ferroelectric layer is formed in the smallest region, the parasitic capacitance or load capacitance of the signal electrodes can be further decreased.

The memory cells may be disposed over a base, and a dielectric layer may be provided between laminates formed of the first signal electrodes and the ferroelectric layer so as to cover part of exposed areas of the base.

The exposed areas of the base and the first signal electrodes may be covered with the dielectric layer over the base.

The dielectric layer may be formed of a material having a dielectric constant lower than a dielectric constant of the ferroelectric layer.

A surface-modifying layer having a surface characteristic differing from a surface characteristic of a surface of the base may be formed over the base.

The surface-modifying layer may be disposed in regions in which the memory cells are not formed and may have a surface exhibiting weaker affinity to a material which forms the memory cells than a surface of the base. The surface-modifying layer may be disposed in regions in which the memory cells are formed and may have a surface exhibiting stronger affinity to a material which forms the memory cells than a surface of the base.

The ferroelectric memory device of the present invention may have the following configurations.

(A) The ferroelectric memory device may comprise an insulating base, the memory cell array may comprise the first signal electrodes provided in grooves formed in the insulating base, the ferroelectric layer, and the second signal electrodes, and the ferroelectric layer and the second signal electrodes maybe layered over the insulating base in which the first signal electrodes are formed.

The insulating base used herein refers to a base of which at least the surface area on which the first signal electrodes are formed has insulating properties. The insulating base may be a base formed of a conductive material of which only the surface area is provided with insulating properties (hereinafter the same).

(B) The memory cell array may comprise an insulating base, and depressed sections and projected sections may be provided to the insulating base in a given pattern, the first signal electrodes may be disposed at a bottom of the depressed sections and on the upper surface of the projected sections, and the ferroelectric layer and the second signal electrodes may be stacked over the insulating base over which the first signal electrodes are formed.

(C) A plurality of unit blocks of the above ferroelectric memory device may be arranged in a given pattern.

(D) The ferroelectric memory device may comprise a plurality of memory cell arrays, and the plurality of memory cell arrays may be layered.

(E) Insulation layers may be provided between the first signal electrodes, and the upper surfaces of the first signal electrodes may be on the same level as upper surfaces of the insulation layers.

Manufacturing Method of Ferroelectric Memory Device

A method of manufacturing a ferroelectric memory device comprises steps of:

(a) forming a peripheral circuit section for selectively writing information into or reading information from the memory cell over a semiconductor substrate; and (b) forming at least first signal electrodes, second signal electrodes arranged in a direction intersecting the first signal electrodes, and a ferroelectric layer disposed at least in intersection regions between the first signal electrodes and the second signal electrodes, and forming a memory cell array in which memory cells are arranged in a matrix, wherein the peripheral circuit section is formed in a region outside the memory cell array.

The step (b) may comprise steps of: (b-1) forming the first signal electrodes; (b-2) forming the ferroelectric layer; and (b-3) forming the second signal electrodes.

The step (b-2) may comprise a step of forming an amorphous ferroelectric layer or a microcrystalline ferroelectric layer, and a step of forming the ferroelectric layer by subjecting the amorphous ferroelectric layer or the microcrystalline ferroelectric layer to a heat treatment. In the case of forming the ferroelectric layer by using selective growth, this enables the ferroelectric layer to be selectively grown at a lower temperature in comparison with other formation methods.

The step (b-2) may have any of the following features.

(1) As the first feature, the step (b-2) may be a step of forming the ferroelectric layer linearly along the first signal electrodes.

In this feature, the method may comprise:

a step of forming, over a base, a first region having a surface characteristic which causes a material for forming at least one of the first signal electrodes or the ferroelectric layer to be deposited preferentially, and a second region having a surface characteristic which causes a material for forming at least one of the first signal electrodes or the ferroelectric layer to be less deposited than the first region; and a step of providing a material for forming at least one of the first signal electrodes or the ferroelectric layer and selectively forming the material in the first region.

The first region and the second region may be formed on a surface of the base.

A surface of the base may be exposed in the first region, and a surface-modifying layer that has a surface characteristic exhibiting weaker affinity to the material for forming the first signal electrodes and the ferroelectric layer than the exposed surface of the base in the first region may be formed in the second region.

A surface of the base may be exposed in the second region, and a surface-modifying layer that has a surface characteristic exhibiting stronger affinity to the material for forming the first signal electrodes and the ferroelectric layer than the exposed surface of the base in the second region may be formed in the first region.

A dielectric layer may be provided between laminates formed of the first signal electrodes and the ferroelectric layer so as to cover exposed areas of the base.

The dielectric layer may be formed of a material having a dielectric constant lower than a dielectric constant of the ferroelectric layer.

(2) As a second feature, the ferroelectric layer and the second signal electrodes may be formed in a direction intersecting the first signal electrodes, and the ferroelectric layer may be formed linearly along the second signal electrodes.

In this feature, the ferroelectric layer and the second signal electrodes may be patterned by etching using the same mask.

A dielectric layer may be provided between laminates formed of the ferroelectric layer and the second signal electrode so as to cover exposed areas of the base and the first signal electrodes.

The dielectric layer may be formed of a material having a dielectric constant lower than a dielectric constant of the ferroelectric layer.

(3) As a third feature, The method may comprise a step (b-4) of patterning the ferroelectric layer after the step (b-3), and causing the ferroelectric layer to remain in a shape of a block only in intersecting regions between the first signal electrodes and the second signal electrodes.

In this case, the method may comprise:

a step of forming, over the base, a first region having a surface characteristic which causes a material for forming at least one of the first signal electrodes or the ferroelectric layer to be deposited preferentially, and a second region having a surface characteristic which causes a material for forming at least one of the first signal electrodes or the ferroelectric layer to be less deposited than the first region; and a step of providing a material for forming at least one of the first signal electrodes or the ferroelectric layer and selectively forming the material in the first region.

The first region and the second region may be formed on a surface of the base.

A surface of the base may be exposed in the first region, and a surface-modifying layer that has a surface characteristic exhibiting weaker affinity to the material for forming the first signal electrodes and the ferroelectric layer than the exposed surface of the base in the first region may be formed in the second region.

A surface of the base may be exposed in the second region, and a surface-modifying layer that has a surface characteristic exhibiting stronger affinity to the material for forming the first signal electrodes and the ferroelectric layer than the exposed surface of the base in the second region may be formed in the first region.

The ferroelectric layer and the second signal electrodes may be patterned by etching using the same mask.

A dielectric layer may be provided between laminates formed of the first signal electrodes and the ferroelectric layer so as to cover exposed areas of the base.

A dielectric layer may be provided between laminates formed of the ferroelectric layer and the second signal electrode so as to cover exposed areas of the base and the first signal electrodes.

The dielectric layer may be formed of a material having a dielectric constant lower than a dielectric constant of the ferroelectric layer.

The method of manufacturing a ferroelectric memory device of the present invention may further comprise the following step.

The method may comprise a step (b-5) of forming insulation layers between the first signal electrodes after the step (b-1), and upper surfaces of the insulation layers may be on the same level as upper surfaces of the first signal electrodes.

Inclusion of the step (b-5) enables the ferroelectric layer to be formed on the planar surface. Therefore, a ferroelectric layer with a desired pattern can be easily formed.

Specifically, the step (b-5) may be a step of forming the insulation layers using a solution application process and planarizing the insulation layers.

Embedded Device

An embedded device of the present invention comprises:
the ferroelectric memory device of the present invention, and
at least one component selected from a group including a flash memory, a processor, an analog circuit, and an SRAM.

BRIEF DESCRIPTION OF THE DRAWINGS

FIG. 15 is a plan view schematically showing a portion of a memory cell array including ferroelectric capacitors according to a fourth embodiment.

FIG. 16 is a cross-sectional view along the line D—D shown in FIG. 15.

DETAILED DESCRIPTION OF THE INVENTION

Embodiments of the present invention are described below with reference to the drawings.

First Embodiment

Device

Figure 1:
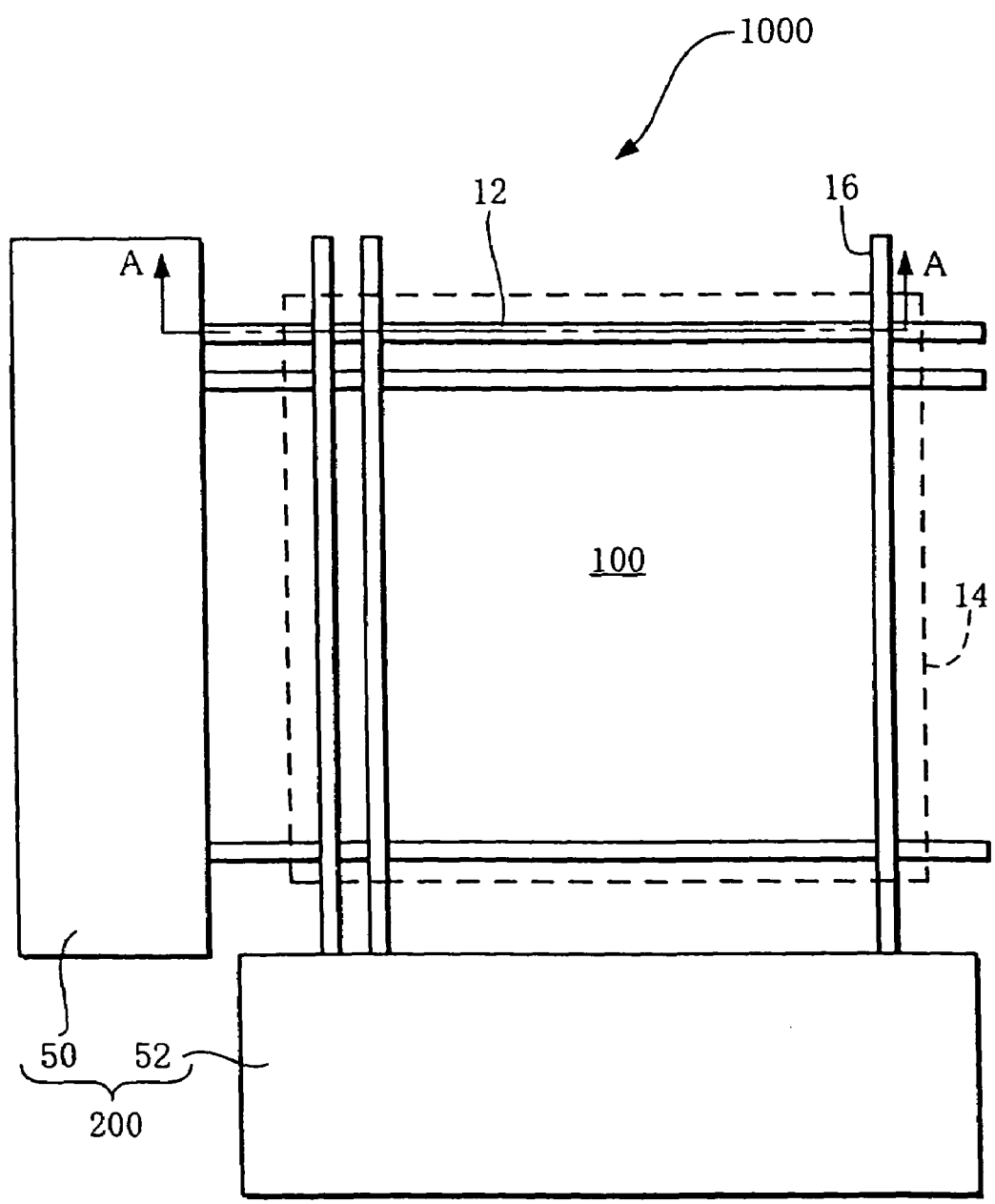
FIG. 1 is a plan view schematically showing a ferroelectric memory device according to a first embodiment.
Figure 2:
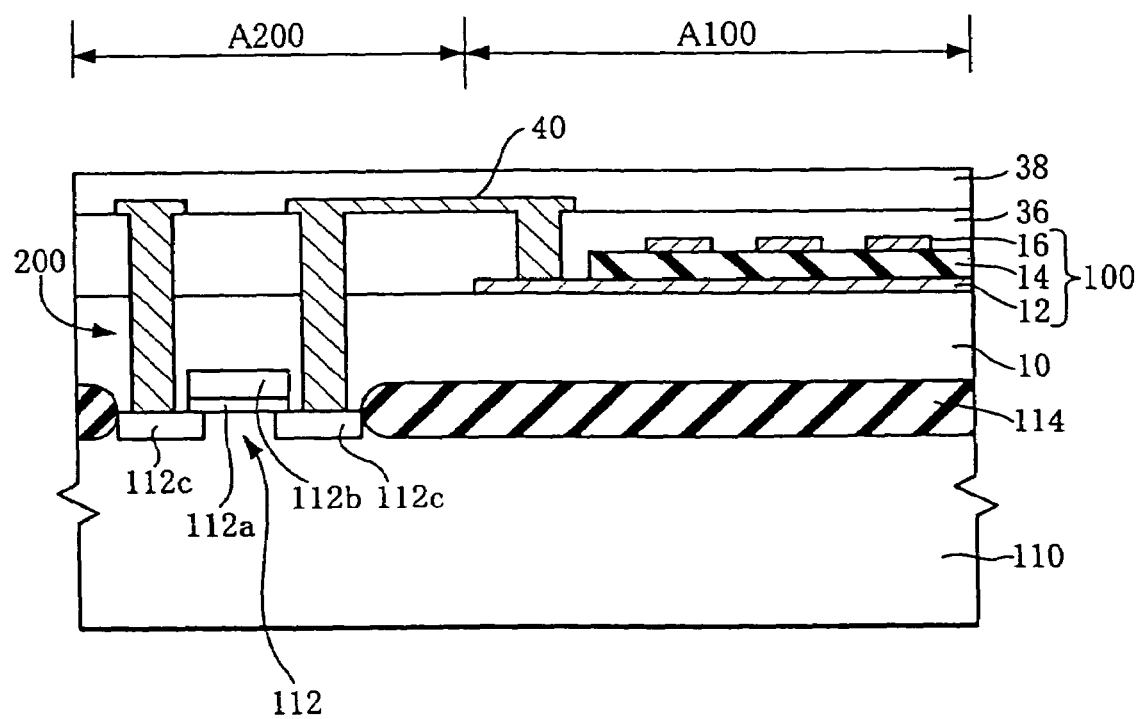
FIG. 2 is a cross-sectional view schematically showing part of the ferroelectric memory device along the line A—A shown in FIG. 1.

FIG. 1 is a plan view schematically showing a ferroelectric memory device according to a first embodiment. FIG. 2 is a cross-sectional view schematically showing part of the ferroelectric memory device along the line A—A shown in FIG. 1.

A ferroelectric memory device 1000 of the present embodiment includes a memory cell array 100 and a peripheral circuit section 200. The memory cell array 100 and the peripheral circuit section 200 are formed in different layers. The peripheral circuit section 200 is formed in a region outside the memory cell array 100. Specifically, a formation region A200 of the peripheral circuit section is provided outside a formation region A100 of the memory cell array. In this example, the peripheral circuit section 200 is formed in a lower layer and the memory cell array 100 is formed in an upper layer. As specific examples of the peripheral circuit section 200, a Y gate, sense amplifier, input-output buffer, X address decoder, Y address decoder, and address buffer can be given.

In the memory cell array 100, first signal electrodes (word lines) 12 for selecting rows and second signal electrodes (bit lines) 16 for selecting columns are arranged so as to intersect at right angles. The first signal electrodes may be the bit lines and the second signal electrodes may be the word lines, differing from this example.

A ferroelectric layer 14 is disposed between the first signal electrodes 12 and the second signal electrodes 16, as shown in FIG. 2. Therefore, memory cells consisting of ferroelectric capacitors are formed in each intersection region between the first signal electrodes 12 and the second signal electrodes 16. The ferroelectric layer 14 is formed so that the ferroelectric layer 14 is continuous between the adjacent memory cells. Specifically, the ferroelectric layer 14 is continuously formed in the formation region A100 of the memory cell array.

A first protective layer 36 is formed of an insulation layer so as to cover the first signal electrodes 12, the ferroelectric layer 14, and the second signal electrodes 16. An insulating second protective layer 38 is formed on the first protective layer 36 so as to cover second interconnect layers 40.

The peripheral circuit section 200 includes various types of circuits for allowing information to be selectively written into or read from the memory cells. For example, the peripheral circuit section 200 includes a first driver circuit 50 for selectively controlling the first signal electrodes 12, a second driver circuit 52 for selectively controlling the second signal electrodes 16, and a signal detecting circuit (not shown) such as a sense amplifier, as shown in FIG. 1.

The peripheral circuit section 200 includes MOS transistors 112 formed on a semiconductor substrate 110, as shown in FIG. 2. The MOS transistor 112 includes a gate insulation layer 112a, a gate electrode 112b, and source/drain regions 112c. Each MOS transistor 112 is isolated from the others by the element isolation regions 114. A first interlayer dielectric 10 is formed on the semiconductor substrate 110 on which the MOS transistors 112 are formed. The peripheral circuit section 200 and the memory cell array 100 are electrically connected through the first interconnect layers 40.

An example of a read or write operation of the ferroelectric memory device 1000 of the present embodiment is described below.

In the read operation, a read voltage "$V_0$" is applied to the capacitor in the selected cell. This also serves as a write operation of data "0". At this time, current flowing through the selected bit line or a potential when causing the bit line to be in a high impedance state is read by the sense amplifier. A given voltage is applied to the capacitors in the non-selected cells in order to prevent occurrence of crosstalk during the read operation.

In the write operation, a voltage "$-V_0$" is applied to the capacitor in the selected cell in the case of writing data "1". In the case of writing data "0", a voltage which does not cause polarization inversion of the selected cell to occur is applied to the capacitor in the selected cell, thereby holding the "0" state written during the read operation. At this time, a given voltage is applied to the capacitors in the non-selected cells in order to prevent occurrence of crosstalk during the write operation.

According to the ferroelectric memory device having the above-described configuration, the peripheral circuit section is not formed below the memory cell array 100. Therefore, since the base under the first interlayer dielectric 10 is planar, the thickness of the first interlayer dielectric 10 can be made uniform during deposition. The more uniform the thickness of the first interlayer dielectric 10 during deposition, the easier planarization of the first interlayer dielectric 10. As a result, the memory cell array 100 with a given pattern can be easily formed.

Device Manufacturing Method

Figure 3:
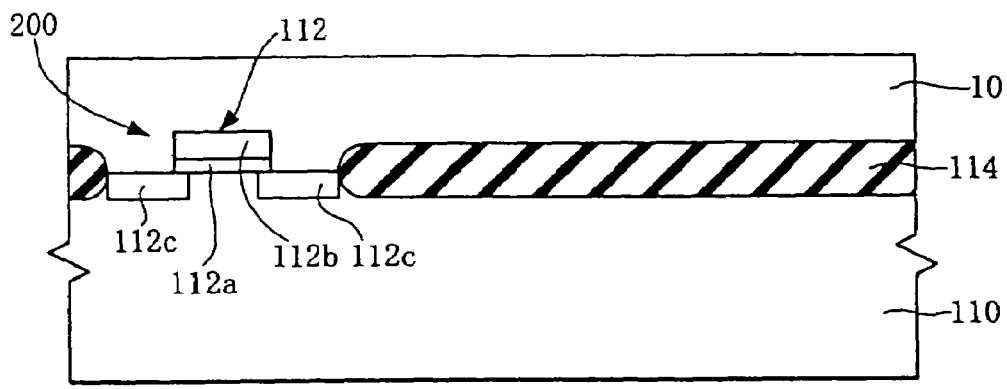
FIG. 3 is a cross-sectional view schematically showing a manufacturing step of the ferroelectric memory device.
Figure 4:
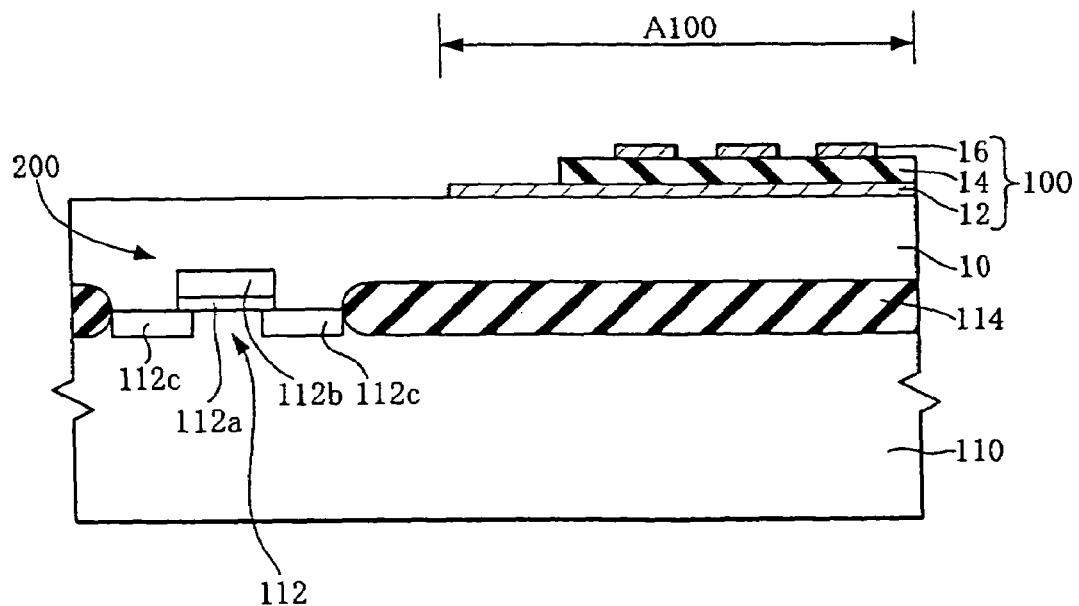
FIG. 4 is a cross-sectional view schematically showing a manufacturing step of the ferroelectric memory device.

An example of a method of manufacturing the above ferroelectric memory device is described below. FIGS. 3 and 4 are cross-sectional views schematically showing manufacturing steps of the ferroelectric memory device 1000.

The peripheral circuit section 200 is formed using a conventional LSI process, as shown in FIG. 3. Specifically, the MOS transistors 112 are formed on the semiconductor substrate 110. For example, the element isolation regions 114 are formed in given regions on the semiconductor substrate 110 using a trench isolation process, a LOCOS process, or the like. After forming the gate insulation layers 112a and the gate electrodes 112b, the source/drain regions 112c are formed by doping the semiconductor substrate 110 with impurities. The peripheral circuit section 200 including various types of circuits such as the driver circuits 50 and 52 and the signal detecting circuit 54 is formed in this manner. The first interlayer dielectric 10 is then formed.

The first signal electrodes 12 are formed on the first interlayer dielectric 10 in the peripheral circuit section 200. As the material for the first signal electrodes 12, Ir, $IrO_x$, Pt, $RuO_x$, $SrRuO_x$, and $LaSrCoO_x$ can be given. As the formation method of the first signal electrodes 12, sputtering, vapor deposition, and the like can be given. The first signal electrodes 12 may have either a single layer structure or a multilayer structure consisting of a plurality of layers.

The first signal electrodes 12 are patterned by etching. As the etching method of the first signal electrodes 12, RIE, sputter etching, plasma etching, and the like can be given.

The ferroelectric layer 14 is formed on the first interlayer dielectric 10 on which the first signal electrodes 12 are formed. As the material for the ferroelectric layer 14, PZT ($PbZr_zTi_{1-z}O_3$), SBT ($SrBi_2Ta_2O_9$), and the like can be given. As the formation method of the ferroelectric layer 14, a spin coating process or a dipping process using a sol-gel material or an MOD material, a sputtering process, an MOCVD process, and a laser ablation process can be given.

The ferroelectric layer 14 is patterned by etching. The ferroelectric layer 14 is patterned so that the ferroelectric layer 14 remains only in the formation region A100 of the memory cell array.

The second signal electrodes 16 are formed on the ferroelectric layer 14. As the material and the formation method for the second signal electrodes 16, the material and the method used for the first signal electrodes 12 maybe applied. The second signal electrodes 16 are patterned by etching. As the etching method of the second signal electrodes 16, the method used for the first signal electrodes 12 may be applied.

The first protective layer 36 is formed of an insulation layer on the ferroelectric layer 14 on which the second signal electrodes 16 are formed. After forming contact holes in given regions of the first protective layer 36, the first interconnect layers 40 with a given pattern are formed. The first interconnect layers 40 electrically connect the peripheral circuit section 100 with the memory cell array 200. The second protective layer 38 is formed of an insulation layer in the uppermost layer. The ferroelectric memory device 1000 is formed in this manner.

Second Embodiment

Figure 5:
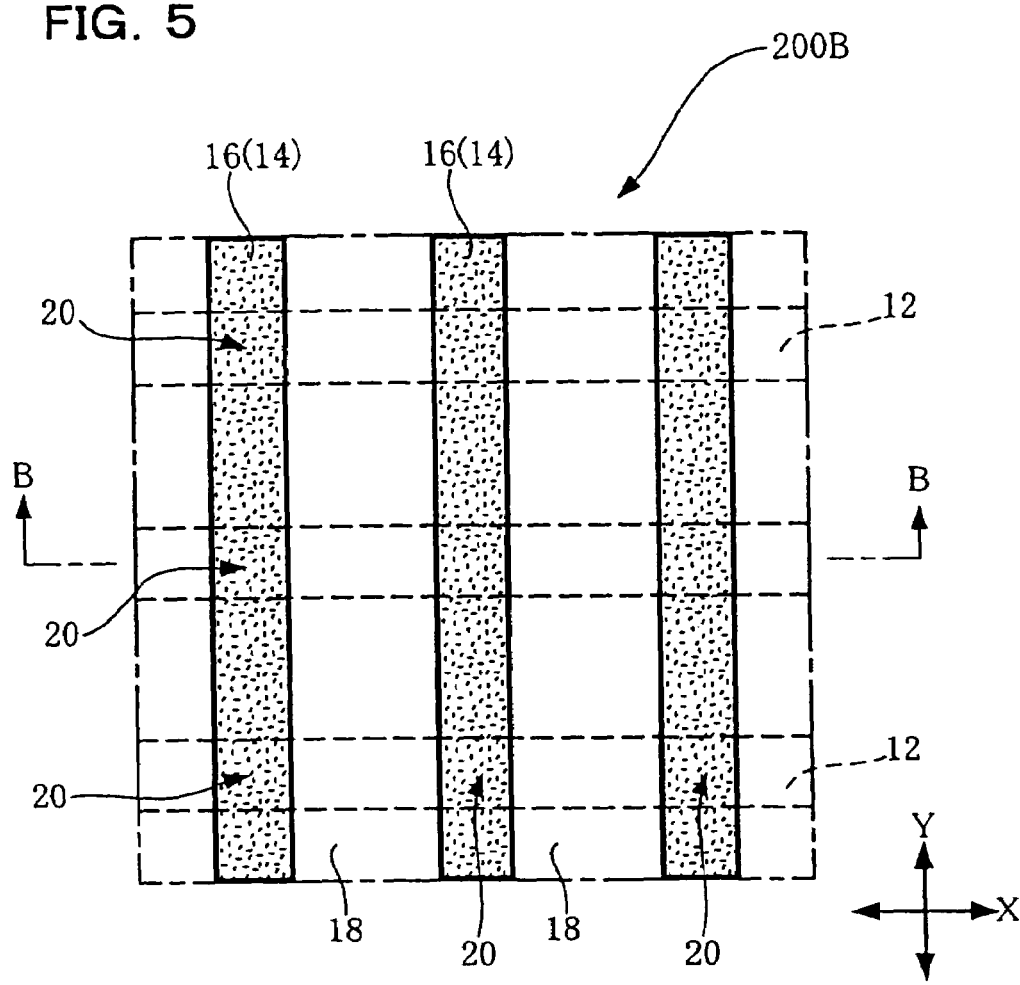
FIG. 5 is an enlarged plan view showing part of a memory cell array.
Figure 6:
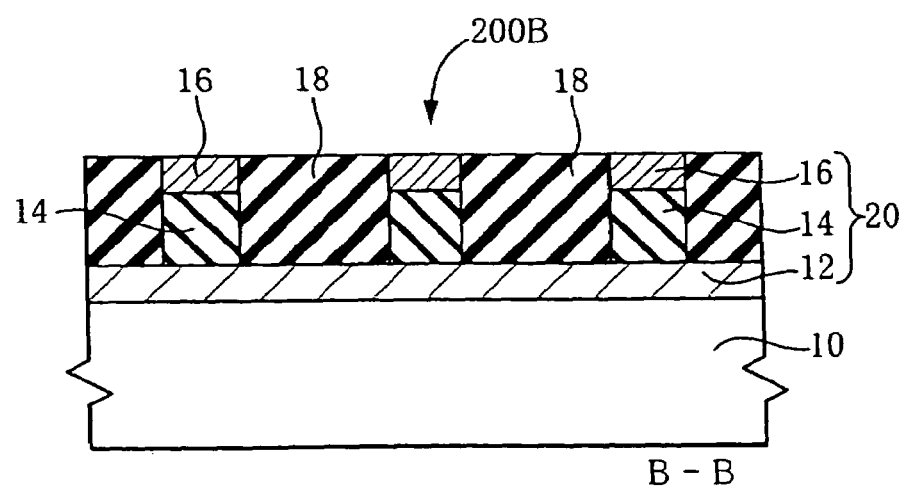
FIG. 6 is a cross-sectional view along the line B—B shown in FIG. 5.

FIG. 5 is an enlarged plan view showing part of the memory cell array. FIG. 6 is a cross-sectional view along the line B—B shown in FIG. 5. In the plan view, numerals in parentheses indicate layers under the uppermost layer. In the present embodiment, sections having substantially the same functions as those of the memory cell array of the first embodiment are indicated by the same symbols.

The ferroelectric memory device according to the second embodiment differs from the first embodiment in that the ferroelectric layer 14 is formed linearly along the second signal electrodes 16. The parasitic capacitance or load capacitance of the first signal electrodes 12 can be decreased by forming the ferroelectric layer 14 linearly. The linear ferroelectric layer 14 may be formed by patterning using a mask used to pattern the second signal electrodes 16 as described later.

A dielectric layer 18 is formed between laminates consisting of the ferroelectric layer 14 and the second signal electrode 16 so as to cover exposed areas of the base 10 and the first signal electrodes 12. The dielectric layer 18 preferably has a dielectric constant lower than that of the ferroelectric layer 14. The parasitic capacitance or load capacitance of the second signal electrodes 16 can be decreased by allowing the dielectric layer 18 having a dielectric constant lower than that of the ferroelectric layer 14 to be interposed between the laminates consisting of the ferroelectric layer 14 and the second signal electrode 16. As a result, a read or write operation of the ferroelectric memory device 1000 can be performed at a higher speed.

Figure 7:
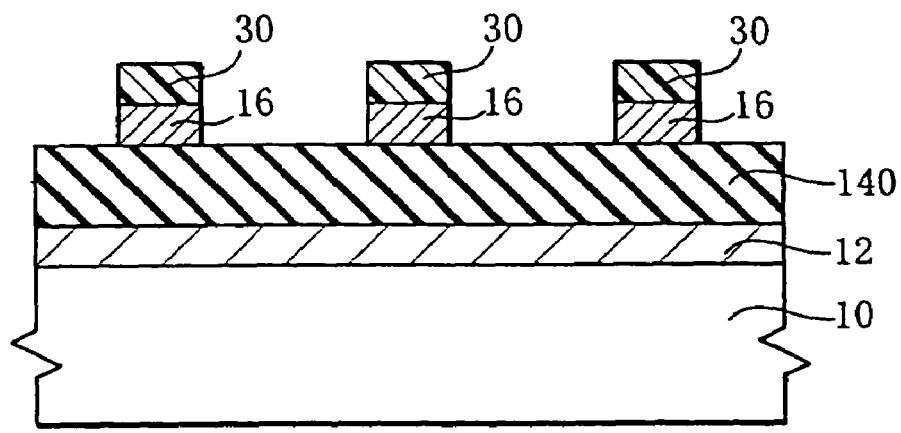
FIG. 7 is a cross-sectional view schematically showing a manufacturing step of a ferroelectric memory device 1000.
Figure 8:
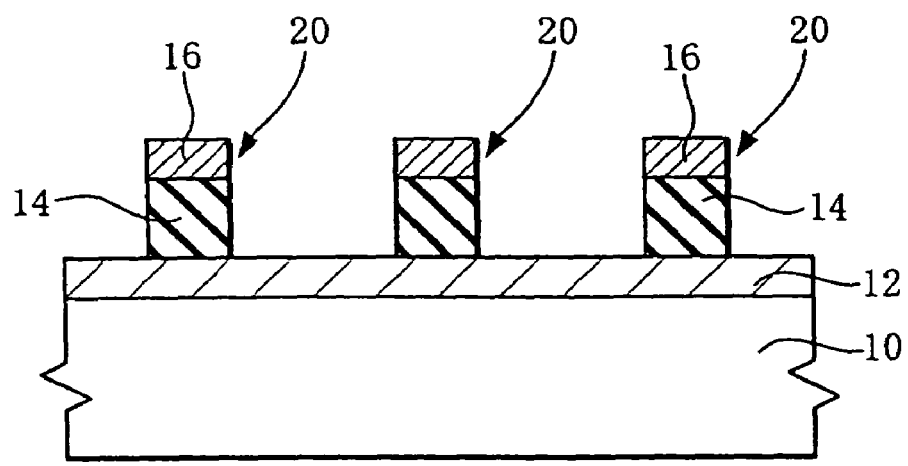
FIG. 8 is a cross-sectional view schematically showing a manufacturing step of the ferroelectric memory device 1000.

An example of a method of manufacturing the above ferroelectric memory device is described below. FIGS. 7 and 8 are cross-sectional views schematically showing manufacturing steps of the ferroelectric memory device 1000.

(1) Formation Step of First Signal Electrode

The first signal electrodes (lower electrodes) 12 arranged in a given pattern are formed on the base (interlayer dielectric, for example) 10, as shown in FIG. 7. The first signal electrodes 12 are formed by depositing an electrode material for forming the first signal electrodes 12 on the base 10 and patterning the deposited electrode material, for example.

There are no specific limitations to the electrode material insofar as the material has a function of making up part of the ferroelectric capacitor. In the case of using PZT as the material for forming the ferroelectric layer 14, platinum, iridium, compounds thereof, or the like may be used as the electrode material for the first signal electrodes 12. As the material for the first signal electrodes 12, Ir, $IrO_x$, Pt, $RuO_x$, $SrRuO_x$, and $LaSrCoO_x$ can be given. The first signal electrodes 12 may be either a single layer or a multilayer consisting of a plurality of layers.

As the deposition method of the electrode material, sputtering, vacuum deposition, CVD, or the like may be used. As the patterning method, lithographic technology may be used. As the method for selectively removing the deposited electrode material, RIE, sputter etching, plasma etching, or the like may be used.

As the formation method of the electrode material, a method using surface-modifying layer which is described in a third embodiment (see steps (1) and (2) in "Device manufacturing method" in third embodiment) may be used without patterning by etching.

(2) Deposition Step of Ferroelectric Layer

A continuous layer 140 consisting of a ferroelectric material (hereinafter called "ferroelectric layer 140") is formed on the entire surface of the base 10 on which the first signal electrodes 12 with a given pattern are formed, as shown in FIG. 7. As the formation method of the ferroelectric layer 140, a spin coating process or a dipping process using a sol-gel material or an MOD (Metal Organic Decomposition) material, a sputtering process, an MOCVD (Metal Organic Chemical Vapor Deposition) process, and a laser ablation process can be given.

The composition of the material for the ferroelectric layer may be appropriately selected insofar as the material exhibits ferroelectricity and can be used as a capacitor insulating film. As examples of such ferroelectrics, PZT ($PbZr_zTi_{1-z}O_3$) and SBT ($SrBi_2Ta_2O_9$) can be given. Materials in which a metal such as niobium, nickel, or magnesium is added to these materials may also be applied. As given examples of ferroelectrics, lead titanate ($PbTiO_3$), lead zirconate titanate ($Pb(Zr,Ti)O_3$), lead zirconate ($PbZrO_3$), lanthanum lead titanate ($(Pb,La),TiO_3$), lanthanum lead zirconate titanate ($(Pb,La)(Zr, Ti)O_3$), lead magnesium niobate zirconium titanate ($Pb(Zr,Ti)(Mg,Nb)O_3$), and the like may be used.

As the materials for these ferroelectrics, in the case of PZT, $Pb(C_2H_5)_4$, $(C_2H_5)_3 PbOCH_2C(CH_3)_3$, or $Pb(C_{11}H_{19}O_2)_2$ for Pb, $Zr(n-OC_4H_9)_4$, $Zr(t-OC_4H_9)_4$, $Zr(C_{11}H_{19}O_2)_4$, or $Zr(C_{11}H_{19}O_2)_4$ for Zr, and $Ti(i-C_3H_7)_4$ for Ti may be used. In the case of SBT, $Sr(C_{11}H_{10}O_2)_2$ for Sr, $Bi(C_6H_5)_3$ for Bi, and $Ta(OC_2H_5)_5$ for Ta may be used.

(3) Formation Step of Second Signal Electrode

The second signal electrodes (upper electrodes) 16 with a given pattern are formed on the ferroelectric layer 140, as shown in FIG. 7. The second signal electrodes 16 are formed by depositing an electrode material for the second signal electrodes 16 on the ferroelectric layer 140 and patterning the deposited electrode material, for example. Specifically, resist layers 30 with a given pattern are formed on the deposited electrode material layer. The electrode material layer is selectively etched using the resist layers 30 as masks, whereby the second signal electrodes 16 are formed.

The material, deposition method, and patterning method using lithography for the second signal electrodes 16 are the same as those of the formation steps of the first signal electrodes 12 described in the above (1). Therefore, further description is omitted.

(4) Patterning Step of Ferroelectric Layer

The ferroelectric layer 14 is patterned by selectively removing the ferroelectric layer 140 using the resist layers 30 as masks, as shown in FIGS. 7 and 8. As the method for selectively removing the deposited ferroelectric material, an etching process such as RIE, sputter etching, or plasma etching may be used. The resist layers 30 are removed by a conventional method such as dissolving or ashing.

(5) Formation Step of Dielectric Layer

The dielectric layer 18 is formed between the laminates consisting of the ferroelectric layer 14 and the second signal electrode 16, as shown in FIG. 6. As the formation method of the dielectric layer 18, a vapor phase process such as CVD, in particular, MOCVD, or a liquid phase process such as a spin coating process or a dipping process may be used.

As the material for the dielectric layer 18, it is preferable to use a dielectric material having a dielectric constant lower than that of the ferroelectric layer 14 which forms the ferroelectric capacitor. In the case of using a PZT material for the ferroelectric layer, an inorganic material such as $SiO_2$, $Ta_2O_5$, $SrTiO_3$, or $MgO$, or an organic material such as a polyimide may be used as the material for the dielectric layer 18. In the case of using an SBT material for the ferroelectric layer 14, an inorganic material such as $SiO_2$, $Ta_2O_5$, $SrTiO_3$, $SrTa_2O_6$, or $SrSnO_3$, or an organic material such as a polyimide may be used as the material for the dielectric layer 18.

The memory cell array 200B is formed by these steps. According to this manufacturing method, the ferroelectric layer 14 which forms the ferroelectric capacitor 20 is continuously patterned using the resist layers 30 used to pattern the second signal electrodes 16 as masks, whereby the number of fabrication steps can be decreased. Moreover, since alignment tolerance for one mask becomes unnecessary in comparison with the case of patterning each layer using different masks, the memory cell array can be highly integrated.

Third Embodiment

Figure 9:
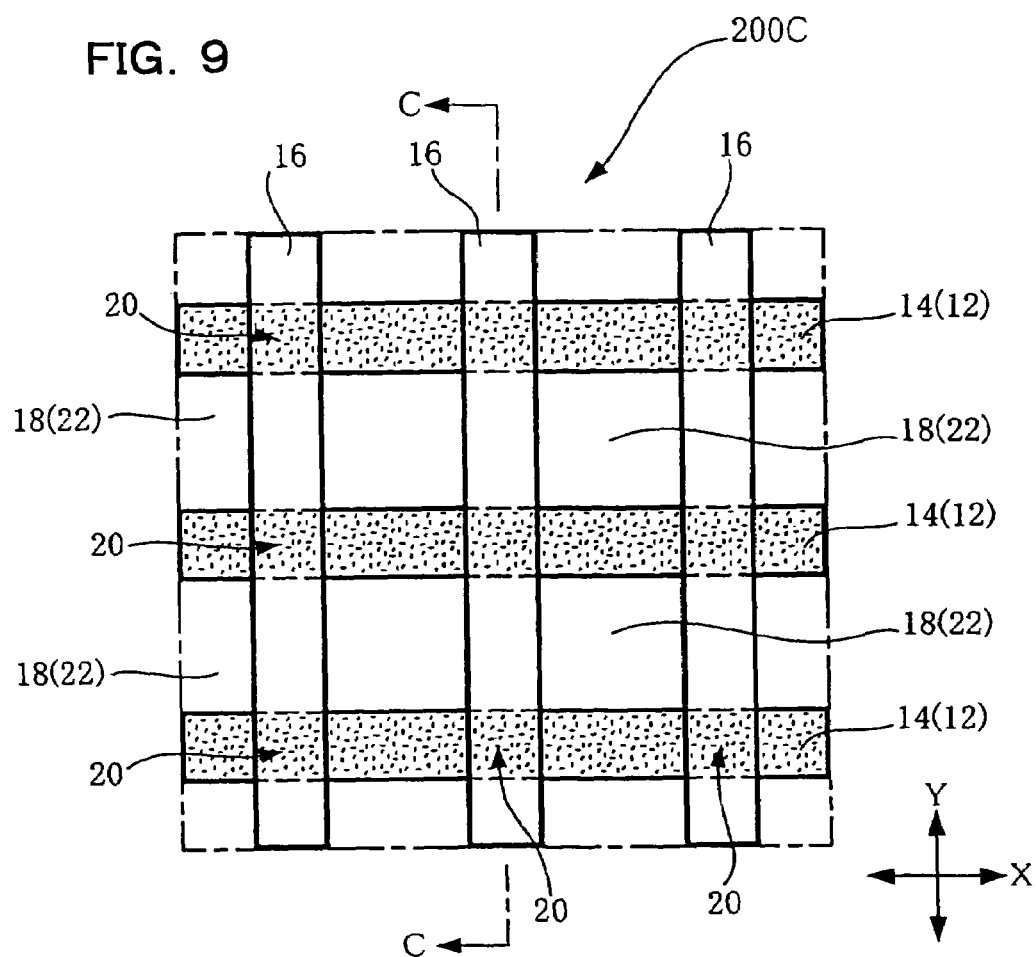
FIG. 9 is a plan view schematically showing a portion of a memory cell array including ferroelectric capacitors according to a third embodiment.
Figure 10:
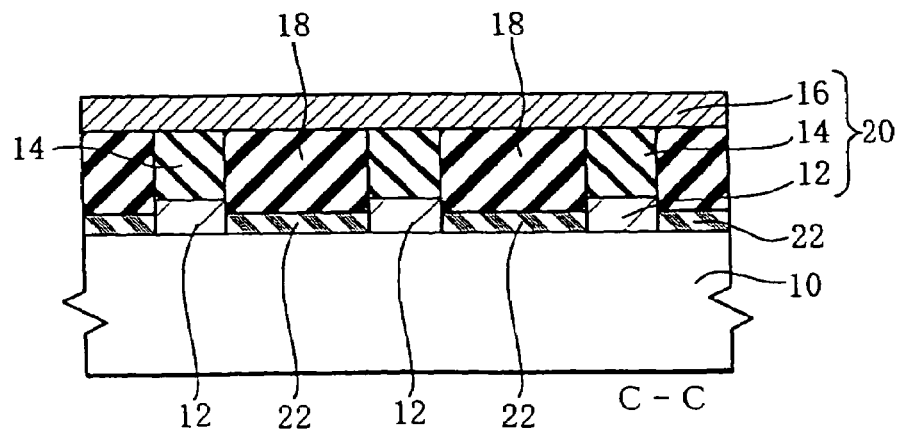
FIG. 10 is a cross-sectional view along the line C—C shown in FIG. 9.

FIG. 9 is a plan view schematically showing a portion of a memory cell array including ferroelectric capacitors according to a third embodiment. FIG. 10 is a cross-sectional view along the line C—C shown in FIG. 9.

In the third embodiment, sections having substantially the same functions as those of the memory cell array of the first embodiment are indicated by the same symbols.

The present embodiment differs from the first embodiment in that the ferroelectric layer which forms the ferroelectric capacitor is linearly layered on the first signal electrodes (lower electrodes).

In a memory cell array 200C according to the present embodiment, the first signal electrodes 12, the ferroelectric layer 14 which forms the ferroelectric capacitors, and the second signal electrodes 16 are layered on the insulating base (interlayer dielectric, for example) 10. The first signal electrode 12, the ferroelectric layer 14, and the second signal electrode 16 make up the ferroelectric capacitor 20. Specifically, memory cells consisting of the ferroelectric capacitors 20 are formed in each intersection region between the first signal electrodes 12 and the second signal electrodes 16.

The first signal electrodes 12 and the second signal electrodes 16 are respectively arranged in the X direction and the Y direction at a given pitch, as shown in FIG. 9.

The ferroelectric layer 14 is selectively formed on the first signal electrodes 12. Surface-modifying layer 22 is formed on the base 10 between the first signal electrodes 12. The dielectric layer 18 is formed on the surface-modifying layer 22. The dielectric layer 18 preferably has a dielectric constant lower than that of the ferroelectric layer 14. The parasitic capacitance or load capacitance of the second signal electrodes 16 can be decreased by allowing the dielectric layer 18 having a dielectric constant lower than that of the ferroelectric layer 14 to be interposed between laminates consisting of the first signal electrode 12 and the ferroelectric layer 14. As a result, read or write operations of the ferroelectric memory device can be performed at a higher speed.

Device Manufacturing Method

FIGS. 11 to 14 are cross-sectional views schematically showing fabrication steps of the memory cell array 200C according to the third embodiment.

(1) Formation of Surface-modifying Layer

A step of providing selectivity to the surface characteristics of the base 10 is performed. Providing selectivity to the surface characteristics of the base 10 means forming regions having different surface characteristics such as wettability for materials to be deposited on the surface of the base 10.

Figure 11:
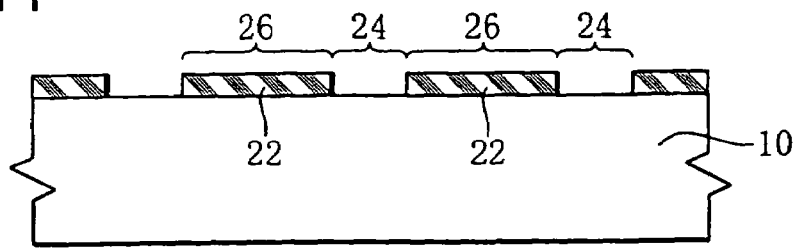
FIG. 11 is a cross-sectional view schematically showing a fabrication step of a memory cell array 200C according to the third embodiment.

In the present embodiment, first regions 24 exhibiting affinity to the material for forming the components of the ferroelectric capacitors, in particular, the material for the electrodes, and second regions 26 exhibiting weak affinity to the materials for forming the components of the ferroelectric capacitor, in particular, the material for the electrodes in comparison with the first regions 24 are formed on the surface of the base 10, as shown in FIG. 11. The ferroelectric capacitors are selectively formed in the first regions 24 in the succeeding steps by utilizing selectivity between each region relating to the deposition rate of the materials or adhesion to the base caused by the difference in the surface characteristics.

Specifically, at least either the first signal electrodes 12 or ferroelectric layer 14 of the ferroelectric capacitors are formed in the first regions 24 in the succeeding steps by a selective deposition process using a chemical vapor deposition (CVD) process, a physical vapor deposition process, or a liquid phase process, for example. In the case where the surface of the base 10 has characteristics which cause the materials for forming the components of the ferroelectric capacitors to be easily deposited, the surface of the base may be exposed in the first regions 24 and the surface-modifying layer 22 on which the above materials are deposited to only a small extent may be formed in the second regions 26, thereby providing selectivity relating to deposition of the materials for forming the components of the ferroelectric capacitors.

In the present embodiment, the surface-modifying layer is formed over the entire surface of the base 10. The surface-modifying layer is removed in the first regions 24 while allowing the surface-modifying layer 22 to remain in the second regions 26, as shown in FIG. 11. Specifically, the following steps are performed.

The surface-modifying layer 22 may be formed using a vapor deposition process such as CVD or using a liquid phase process such as a spin coating process or a dipping process. In the latter case, liquid or a substance dissolved in a solvent is used. A silane coupling agent (organosilicon compound) or a thiol compound may be used as such a substance.

A thiol compound is a generic name for organic compounds containing a mercapto group (—SH) ($R^1$—SH; wherein $R^1$ represents a replaceable hydrocarbon group such as an alkyl group). Such a thiol compound is dissolved in an organic solvent such as dichloromethane or trichloromethane to prepare a solution at a concentration of about 0.1 to 10 mM, for example.

A silane coupling agent is a compound shown by $R^2{}_n SiX_{4-n}$ (wherein n is a natural number, $R^2$ represents a hydrogen atom or a replaceable hydrocarbon group such as an alkyl group), wherein X represents —$OR^3$, —COOH, —$OOCR^3$, —$NH_{3-n}R^3{}_n$, —OCN, halogen, or the like (wherein $R^3$ represents a replaceable hydrocarbon group such as an alkyl group). Of these silane coupling agents and thiol compounds, compounds containing a fluorine atom in which $R^1$ or $R^3$ is $C_nF_{2n+1}C_mH_{2m}$ (wherein n and m are natural numbers) are particularly preferable, because these compounds increase surface free energy, thereby decreasing affinity to other materials.

In addition, films obtained using a compound containing a mercapto group or —COOH group by the above method may also be used. Films formed of these materials may be used in the form of a monomolecular film or a built-up film thereof using an appropriate method.

In the present embodiment, the surface-modifying layer is not formed in the first regions 24, as shown in FIG. 11. In the case of using a silane coupling agent for the surface-modifying layer 22, light irradiation may cause the molecular bonds to break at the interface with the base 10, whereby the surface-modifying layer may be removed. Mask exposure performed in lithography may be applied to patterning using light. The surface-modifying layer may be directly patterned using laser beams, electron beams, ion beams, or the like without using a mask.

The surface-modifying layer 22 may be selectively formed in the second regions 26 by transferring the surface-modifying layer 22 formed on another base. This enables deposition and patterning to be performed at the same time.

The difference in affinity to the materials for forming the components of the ferroelectric capacitors in the succeeding steps can be produced by causing the first regions 24 and the second regions 26 which are covered with the surface-modifying layer 22 to have different surface conditions, as shown in FIG. 11. In particular, if the surface-modifying layer 22 exhibit water repellency due to the possession of a fluorine molecule or the like, the material for forming the components of the ferroelectric capacitors can be selectively provided at the first regions 24 by providing the material in a liquid phase. Depending on the material for the surface-modifying layer 22, the material may be deposited in the first regions 24, on which the surface-modifying layer 22 is not present, using a vapor phase process due to affinity to the material for forming the upper layer components. The components (first signal electrodes 12 and ferroelectric layer 14 in the present embodiment) of the ferroelectric capacitors of the ferroelectric memory device can be formed in the succeeding steps by thus providing selectivity to the surface characteristics of the first regions 24 and the second regions 26.

(2) Formation Step of First Signal Electrode

Figure 12:
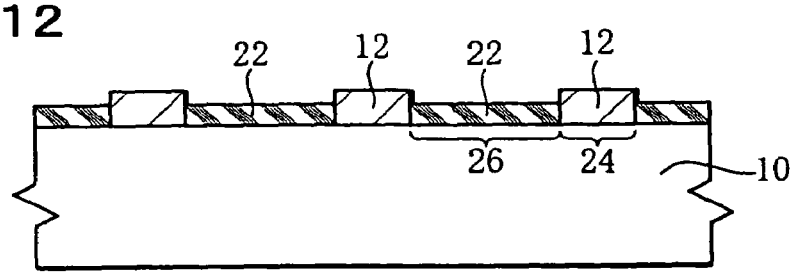
FIG. 12 is a cross-sectional view schematically showing a fabrication step of the memory cell array 200C according to the third embodiment.

The first signal electrodes 12 which become the lower electrodes of the ferroelectric capacitors are formed corresponding to the first regions 24, as shown in FIG. 12. For example, a deposition step using a vapor phase process is performed for the entire surface of the base 10. This allows the selective deposition process to be performed. Specifically, the material is deposited in the first regions 24, but is deposited to only a small extent in the second regions 26, whereby the first signal electrodes 12 are formed only in the first regions 24. It is preferable to apply CVD, in particular, MOCVD as the vapor phase process. It is preferable that the material not be deposited in the second regions 26. However, it suffices that the deposition rate in the second regions 26 be two digits or more lower than that in the first regions 24.

The first signal electrodes 12 maybe formed using a method of selectively supplying a solution of the material to the first regions 24 in a liquid phase, or using a mist deposition process in which a solution of the material is misted using ultrasonic waves or the like and selectively supplied to the first regions 24.

As the material for forming the first signal electrodes 12, platinum, iridium, or the like may be used in the same manner as in the first embodiment. In the case of forming surface characteristic selectivity by forming the first regions 24 and the surface-modifying layer 22 (second regions 26) containing the above material on the base 10, the materials for forming the electrodes can be selectively deposited using $(C_5H_7O_2)_2Pt$, $(C_5HFO_2)_2Pt$, or $(C_3H_5)(C_5H_5)Pt$ for platinum or $(C_3H_5)_3Ir$ for iridium.

(3) Formation Step of Ferroelectric Layer

Figure 13:
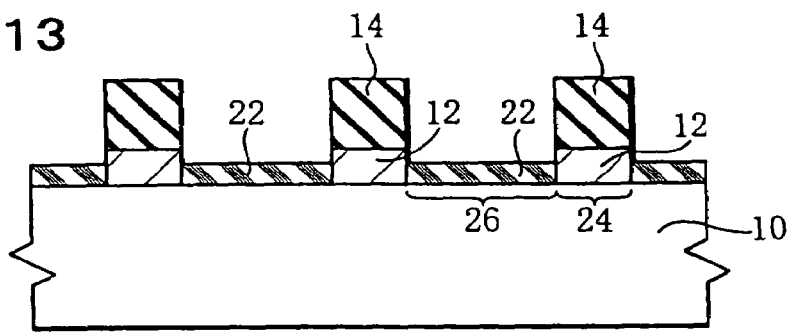
FIG. 13 is a cross-sectional view schematically showing a fabrication step of the memory cell array 200C according to the third embodiment.

The ferroelectric layer 14 is formed on the first signal electrodes 12, as shown in FIG. 13. Specifically, a deposition step using a vapor phase process is performed for the entire surface of the base 10, for example. The material is deposited on the first signal electrodes 12, but is deposited to only a small extent in the second regions 26, whereby the ferroelectric layer 14 is formed only on the first signal electrodes 12. As the vapor phase process, CVD, in particular, MOCVD can be applied.

The ferroelectric layer 14 may be formed using a method of selectively supplying absolution of the material to the first signal electrodes 12 formed other than the second regions 26 in a liquid phase using an ink jet process or the like, or using a mist deposition process in which a solution of the material is misted using ultrasonic waves or the like and selectively supplied to the regions other than the second regions 26.

The composition of the material for the ferroelectric layer 14 may be appropriately selected insofar as the material exhibits ferroelectricity and can be used as the capacitor insulating film. For example, SBT materials, PZT materials, materials to which niobium or a metal oxide such as nickel oxide or magnesium oxide is added, and the like may be used. As specific examples of ferroelectrics, those illustrated in the second embodiment can be given. As specific examples of the materials for ferroelectrics, those illustrated in the second embodiment can be given.

The ferroelectric layer 14 may be formed as follows. Specifically, the ferroelectric layer may be formed by forming ferroelectric precursor layers and subjecting the ferroelectric precursor layers to a heat treatment. As the ferroelectric precursor layers, an amorphous or microcrystalline SBT film and an amorphous or microcrystalline PZT film can be given. As the formation method of the ferroelectric precursor layers, an application process, sputtering process, a CVD process, a laser ablation process, and the like can be given. The heat treatment temperature varies depending on the type of film. In the case of an amorphous SBT film, the heat treatment temperature is 600 to 700° C., and preferably 600 to 650° C. In the case of an amorphous PZT film, the heat treatment temperature is 400 to 500° C., and preferably 400 to 450° C. According to this formation method of the ferroelectric layer, the ferroelectric layer can be formed at a lower temperature in comparison with other formation methods. Therefore, the constituent substances of the ferroelectric can be prevented from being removed from the base 10 reliably in comparison with other formation methods.

(4) Formation Step of Dielectric Layer

Figure 14:
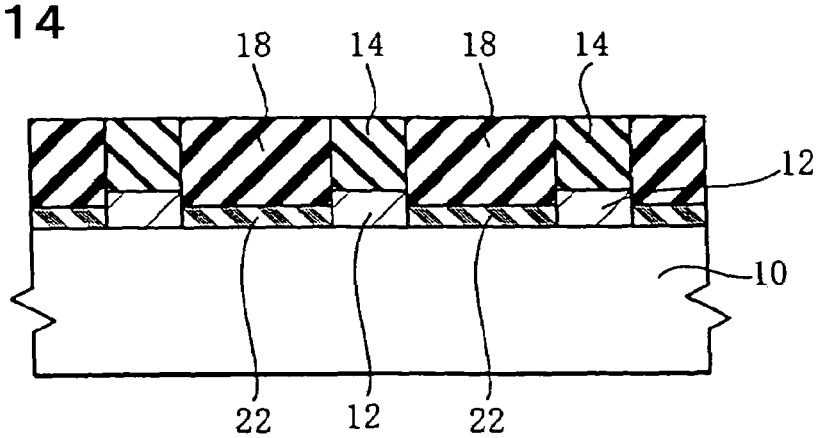
FIG. 14 is a cross-sectional view schematically showing a fabrication step of the memory cell array 200C according to the third embodiment.

The dielectric layer 18 is formed in the second regions 26, specifically, in the regions between laminates consisting of the first signal electrode 12 and the ferroelectric layer 14 formed in the first regions 24, as shown in FIG. 14. As the formation method of the dielectric layer 18, a vapor phase process such as CVD, in particular, MOCVD, or a liquid phase process such as a spin coating process or a dipping process may be used. The dielectric layer 18 is preferably planarized so as to have a surface at the same level as the ferroelectric layer 14 using a CMP (Chemical Mechanical Polishing) process or the like. The second signal electrodes 16 can be easily formed with high accuracy by planarizing the dielectric layer 18 in this manner.

As the material for the dielectric layer 18, it is preferable to use a dielectric material having a dielectric constant lower than that of the ferroelectric layer 14 which forms the ferroelectric capacitors. In the case of using a PZT material for the ferroelectric layer, an inorganic material such as $SiO_2$, $Ta_2O_5$, $SrTiO_3$, or MgO or an organic material such as polyimide may be used as the material for the dielectric layer 18. In the case of using an SBT material for the ferroelectric layer 14, an inorganic material such as $SiO_2$, $Ta_2O_5$, $SrTiO_3$, $SrTa_2O_6$, or $SrSnO_3$, or an organic material such as a polyimide may be used as the material for the dielectric layer 18.

(5) Formation Step of Second Signal Electrode

The second signal electrodes (upper electrodes) 16 with a given pattern are formed on the ferroelectric layer 14 and the dielectric layer 18, as shown in FIG. 10. The second signal electrodes 16 are formed by depositing an electrode material for the second signal electrodes 16 on the ferroelectric layer 14 and the dielectric layer 18 and patterning the deposited electrode material, for example.

There are no specific limitations to the electrode material insofar as the material has a function of making up part of the ferroelectric capacitors. In the case of using PZT as the material for forming the ferroelectric layer 14, platinum, iridium, compounds thereof, or the like may be used as the electrode material for the second signal electrodes 16 in the same manner as in the second embodiment. The second signal electrodes 16 may be either as a single layer or a multilayer consisting of a plurality of layers.

As the deposition method of the electrode material, sputtering, vacuum deposition, CVD, or the like may be used in the same manner as in the first embodiment. As the patterning method, lithographic technology may be used.

An insulating protective layer may optionally be formed on the entire surfaces of the ferroelectric layer 14, dielectric layer 18, and second signal electrodes 16. The memory cell array 200C according to the present embodiment can be formed in this manner.

According to the manufacturing method of the present invention, at least one component which makes up the ferroelectric capacitor can be selectively formed in the first regions 24, but is formed to only a small extent in the second regions 26. Therefore, at least either the first signal electrodes (lower electrodes) or the, ferroelectric layer (first signal electrodes 12 and ferroelectric layer 14 in the present embodiment) can be formed without etching. This method can prevent occurrence of a problem relating to readhering substances caused by by-products produced during etching such as in the case of patterning the first signal electrodes using sputter etching.

In the manufacturing method of the present invention, the surface-modifying layer 22 in the second regions 26 may be removed after the step shown in FIG. 13. This step is performed after the deposition steps of the first signal electrodes 12 and the ferroelectric layer 14 have been completed. The surface-modifying layer 22 may be removed using the method described relating to the patterning step of the surface modifying layer, for example. It is preferable to remove substances adhering to the surface of the surface-modifying layer 22 when removing the surface-modifying layer 22. For example, in the case where the material for the first signal electrodes 12 or the ferroelectric layer 14 adheres to the surface of the surface-modifying layer 22, the material may be removed. The step of removing the surface-modifying layer 22 is not an indispensable condition for the present invention. The surface-modifying layer 22 may be allowed to remain.

In the case where the ferroelectric layer 14 is formed on the side of the first signal electrodes 12, it is preferable to remove these ferroelectric layer 14. In the removal step, dry etching may be applied, for example.

In the present embodiment, the surface-modifying layer 22 is formed in the second regions 26 so that the first regions 24 and the second regions 26 have surface characteristics differing in deposition capability of the material for forming at least one component (at least either the first signal electrode or ferroelectric layer) of the ferroelectric capacitors to be formed in the succeeding steps. As a modification example, the surface-modifying layer 22 may be formed in the first regions 24 and the ferroelectric capacitors may be selectively formed in the first regions 24 by preparing the material for forming at least one component of the ferroelectric capacitors so as to have a composition in a liquid phase or vapor phase so that the material is deposited preferentially on the surface of the surface-modifying layer 22.

Thin surface-modifying layer may be selectively formed on the surface of the second regions 26. The material for forming at least one component of the ferroelectric capacitors may be supplied in a vapor phase or liquid phase over the entire surface of the base including the first regions 24 and the second regions 26, thereby forming the material layer for this component. The material layers for this component may be selectively removed by polishing or by a chemical technique only on the thin surface-modifying layer to selectively obtain the material layers for this component in the first regions 24.

In addition, a surface treatment may be selectively performed without forming layers on the surfaces of the first regions 24 and the second regions 26 so that the material for forming at least one component of the ferroelectric capacitors is deposited preferentially in the first regions 24.

Formation of the first signal electrodes (lower electrodes) and the ferroelectric layer using the surface-modifying layer, which is the feature of the present embodiment, is described in an International Patent Application based on the patent cooperation treaty applied for by the applicant of the present invention (application number: PCT/JP00/03590).

The method of manufacturing a ferroelectric memory device according to the present embodiment may be modified as follows.

The lower electrodes and the ferroelectric layer may be deposited in that order without using surface-modifying layer, and the lower electrodes and the ferroelectric layer may be continuously patterned using the same mask.

Fourth Embodiment

Figure 17:
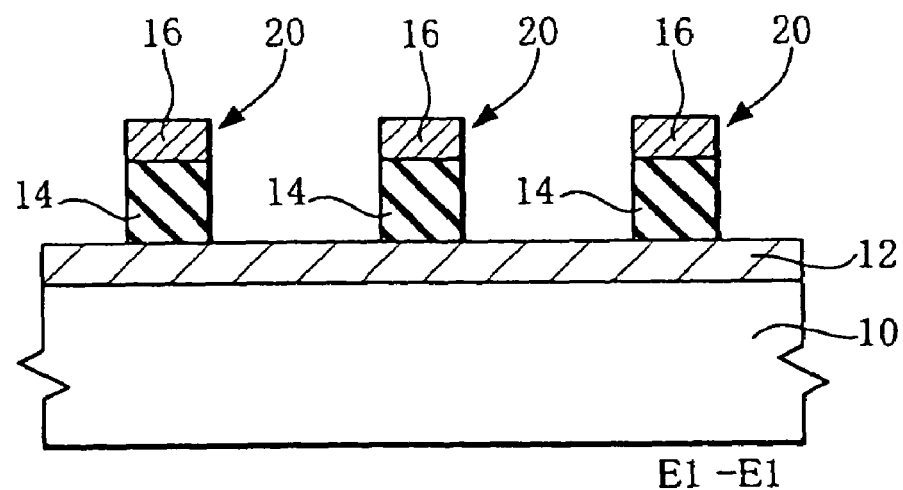
FIG. 17 is a cross-sectional view along the line E1—E1 shown in FIG. 15.
Figure 18:
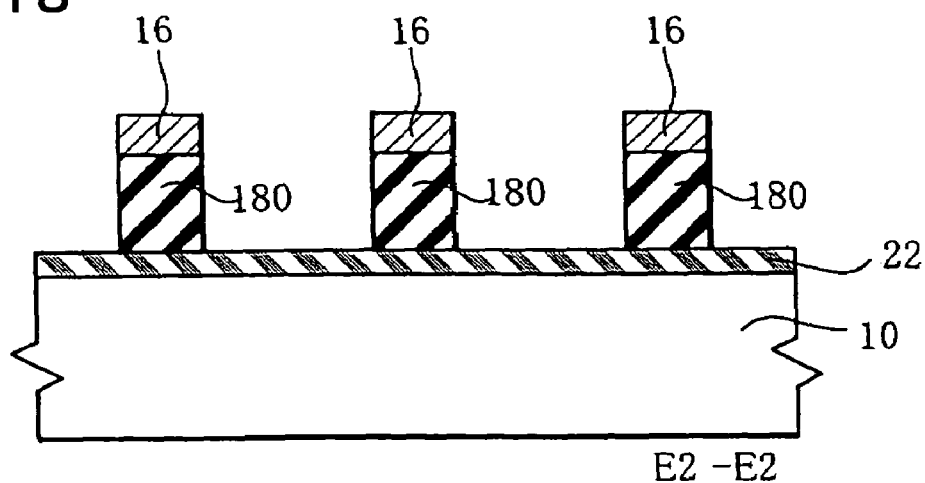
FIG. 18 is a cross-sectional view along the line E2—E2 shown in FIG. 15.

FIG. 15 is a plan view schematically showing a portion of a memory cell array including ferroelectric capacitors according to the present embodiment. FIG. 16 is a cross-sectional view along the line D—D shown in FIG. 15. FIG. 17 is a cross-sectional view along the line E1—E1 shown in FIG. 15. FIG. 18 is a cross-sectional view along the line E2—E2 shown in FIG. 15.

In the present embodiment, sections having substantially the same functions as those of the memory cell array of the first embodiment are indicated by the same symbols.

The present embodiment differs from the first and second embodiments in that the ferroelectric layer 14 which forms the ferroelectric capacitors is formed only in the intersection regions between the first signal electrodes 12 and the second signal electrodes 16.

In a memory cell array 200D according to the present embodiment, the first signal electrodes 12, the ferroelectric layer 14 which forms the ferroelectric capacitor, and the second signal electrodes 16 are layered on the insulating base 10. The first signal electrode 12, the ferroelectric layer 14, and the second signal electrode 16 make up the ferroelectric capacitor 20. Specifically, memory cells consisting of the ferroelectric capacitors 20 are formed in each intersection region between the first signal electrodes 12 and the second signal electrodes 16. The first signal electrodes 12 and the second signal electrodes 16 are respectively arranged in the X direction and the Y direction at a given pitch, as shown in FIG. 15.

The ferroelectric layer 14 is selectively formed only in the intersection regions between the first signal electrodes 12 and the second signal electrodes 16. In a view along the second signal electrode 16 shown in FIG. 16, the ferroelectric layer 14 and the second signal electrodes 16 are layered on the first signal electrodes 12 on the base 10. The surface-modifying layer 22 is disposed between the first signal electrodes 12. The dielectric layer 18 is formed on the surface-modifying layer 22. In a view along the first signal electrode 12 shown in FIG. 17, the ferroelectric layer 14 and the second signal electrodes 16 are layered at a given position of the first signal electrodes 12. No layer is present between laminates consisting of the ferroelectric layer 14 and the second signal electrode 16. In a view along the first signal electrode 12 shown in FIG. 17, the ferroelectric layer 14 and the second signal electrodes 16 are layered at a given position of the first signal electrodes 12. In a view along the X direction shown in FIG. 18 in which the first signal electrodes 12 are not formed, the dielectric layer 180 and the second signal electrodes 16 are layered at a given position of the surface-modifying layer 22. Dielectric layer may optionally be formed between laminates consisting of the ferroelectric layer 14 and the second signal electrode 16 and between laminates consisting of the dielectric layer 180 and the second signal electrode 16.

The dielectric layer 180 and the dielectric layer which is optionally formed preferably have a dielectric constant lower than that of the ferroelectric layer 14. The parasitic capacitance or load capacitance of the first signal electrodes 12 and the second signal electrodes 16 can be decreased by allowing the dielectric layer having a dielectric constant lower than that of the ferroelectric layer 14 to be interposed between the laminates consisting of the first signal electrode 12 and the ferroelectric layer 14 and between the laminates consisting of the ferroelectric layer 14 and the second signal electrode 16. As a result, a read or write operation of the ferroelectric memory device can be performed at a higher speed.

In the present embodiment, the ferroelectric layer 14 which makes up the ferroelectric capacitors 20 are formed only in the intersection regions between the first signal electrodes 12 and the second signal electrodes 16. According to this configuration, the parasitic capacitance or load capacitance of both the first signal electrodes 12 and the second signal electrodes 16 can be decreased.

Device Manufacturing Method

FIGS. 19 to 26 are cross-sectional views schematically showing fabrication steps of the memory cell array 200D according to the present embodiment.

(1) Formation of Surface-modifying Layer

A step of providing selectivity to the surface characteristics of the base 10 is performed. Providing selectivity to the surface characteristics of the base 10 means forming regions having different surface characteristics such as wettability for materials to be deposited on the surface of the base 10. Since the details are described in the second embodiment, only brief description is given below.

Figure 20:
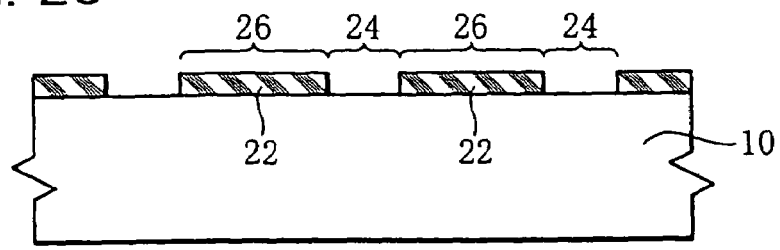
FIG. 20 is a view schematically showing a fabrication step of the memory cell array 200D according to the fourth embodiment.

In the present embodiment, the first regions 24 exhibiting affinity to the materials for forming the components of the ferroelectric capacitors, in particular, the materials for the electrodes, and the second regions 26 exhibiting weak affinity to the materials for forming the components of the ferroelectric capacitors, in particular, the materials for the electrodes in comparison with the first regions 24 are formed on the surface of the base 10, as shown in FIG. 20. The ferroelectric capacitors are selectively formed in the first regions 24 in the succeeding steps by utilizing selectivity between each region relating to the deposition rate of the materials or adhesion to the base caused by the difference in the surface characteristics.

Specifically, in the case where the surface of the base 10 has characteristics which cause the materials for forming the components of the ferroelectric capacitors to be easily deposited, the surface of the base may be exposed in the first regions 24, and the surface-modifying layer 22 on which the materials are deposited to only a small extent may be formed in the second regions 26, thereby providing selectivity relating to deposition of the materials for forming the components of the ferroelectric capacitors.

In the present embodiment, the surface-modifying layer is formed over the entire surface of the base 10. The surface-modifying layer is removed in the first regions 24 while allowing the surface-modifying layer 22 to remain in the second regions 26, as shown in FIG. 20. As the formation method of the surface-modifying layer 22, the method described in the second embodiment may be employed.

(2) Formation Step of First Signal Electrode

Figure 21:
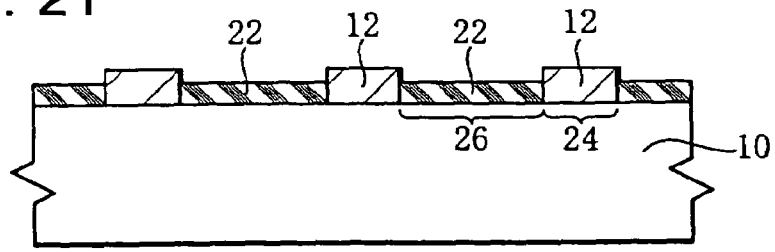
FIG. 21 is a view schematically showing a fabrication step of the memory cell array 200D according to the fourth embodiment.

The first signal electrodes 12 which become the lower electrodes of the ferroelectric capacitors are formed corresponding to the first regions 24, as shown in FIG. 21. As the formation method and the electrode material for the first signal electrodes 12, the method and the material described in the second embodiment may be employed.

(3) Formation Step of Ferroelectric Layer

Figure 22:
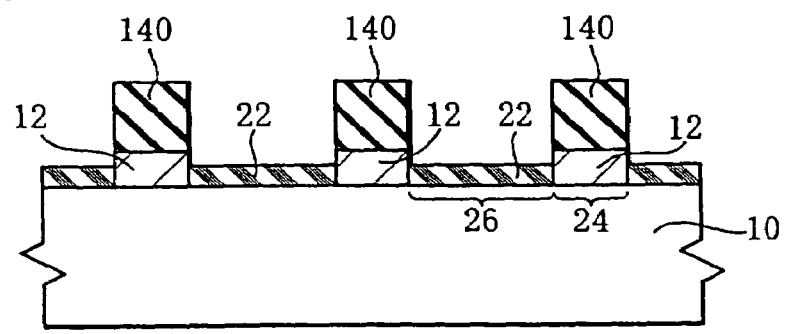
FIG. 22 is a view schematically showing a fabrication step of the memory cell array 200D according to the fourth embodiment.

The ferroelectric layers 140 are formed on the first signal electrodes 12, as shown in FIG. 22. Specifically, a deposition step using a vapor phase process is performed for the entire surface of the base. 10. Since the material is deposited on the first signal electrodes 12, but is deposited to only a small extent in the second regions 26, the ferroelectric layers 140 are formed only on the first signal electrodes 12. As the deposition method of the ferroelectric layers 140, the method described in the second embodiment may be employed.

The composition of the material for the ferroelectric layers 14 may be appropriately selected insofar as the material exhibits ferroelectricity and can be used as a capacitor insulating film. For example, SBT materials, PZT materials, materials to which a metal such as niobium, nickel, or magnesium is added, and the like may be used. As specific examples of ferroelectrics, the ferroelectrics described in the first embodiment can be given. As specific examples of the materials for ferroelectrics, the materials described in the first embodiment can be given.

(4) Formation Step of Dielectric Layer

Figure 19:
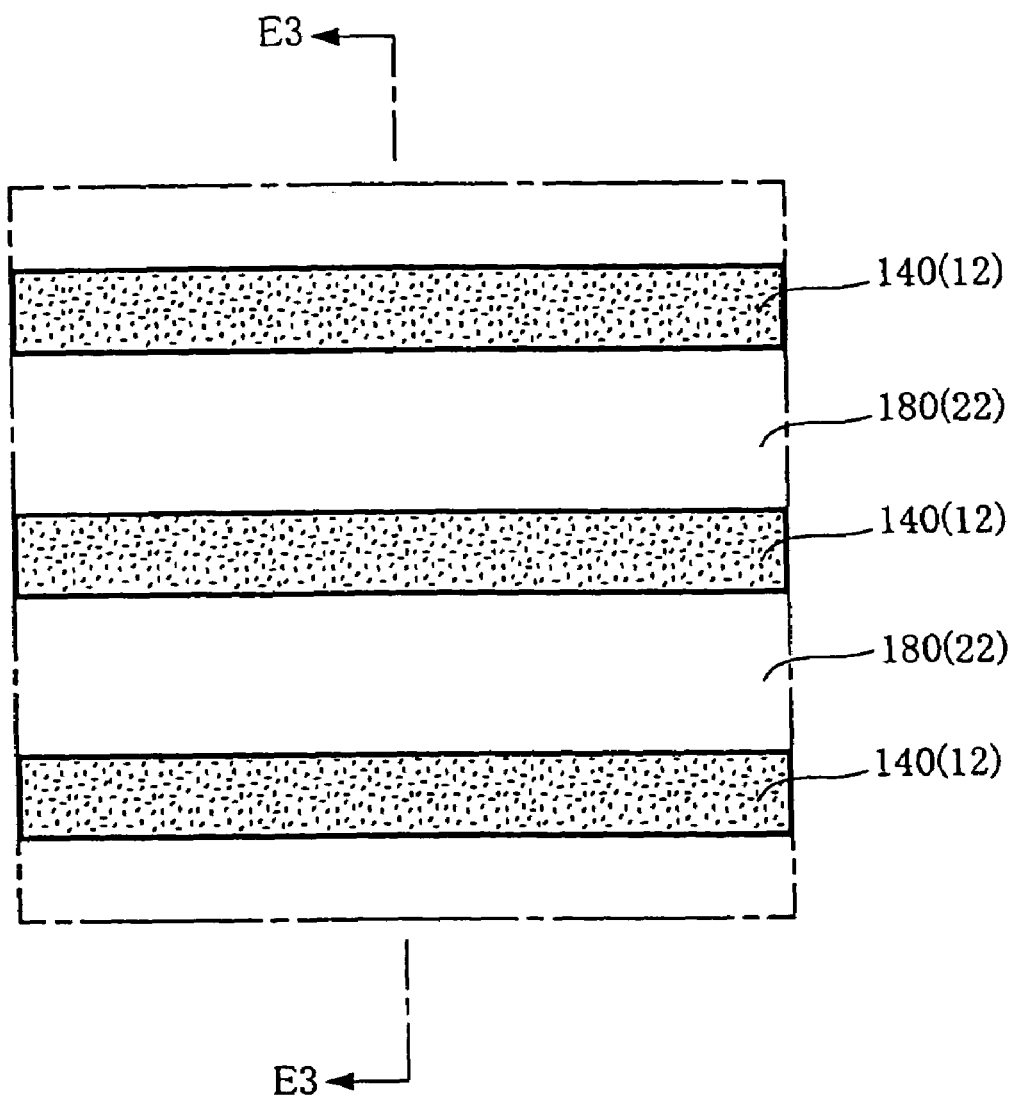
FIG. 19 is a view schematically showing a fabrication step of a memory cell array 200D according to the fourth embodiment.
Figure 23:
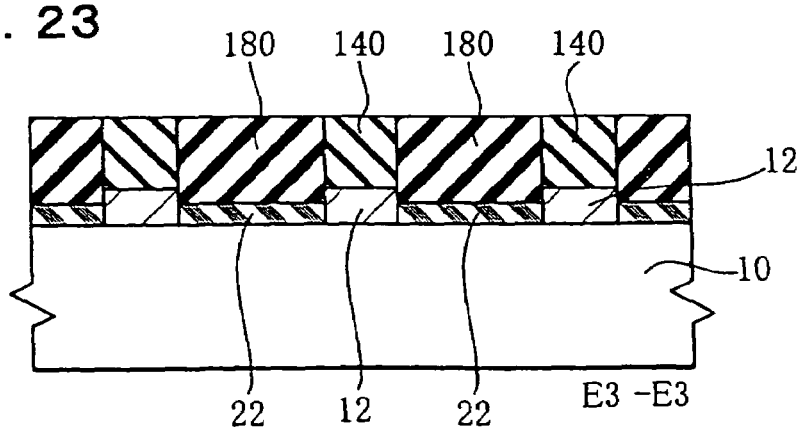
FIG. 23 is a view schematically showing a fabrication step of the memory cell array 200D according to the fourth embodiment.

The dielectric layer 180 is formed in the second regions 26, specifically, in the regions between the laminates consisting of the first signal electrode 12 and the ferroelectric layer 14 formed in the first regions 24, as shown in FIGS. 19 and 23. FIG. 23 is a cross-sectional view along the line E3—E3 shown in FIG. 19.

As the formation method of the dielectric layer 180, the method described in the first embodiment may be employed. The dielectric layer 180 is preferably planarized using a CMP process or the like so as to have a surface at the same level as the ferroelectric layers 140. The second signal electrodes 16 can be easily formed with high accuracy by planarizing the dielectric layer 180 in this manner.

As the material for the dielectric layer 180, it is preferable to use a dielectric material having a dielectric constant lower than that of the ferroelectric layers 14, which make up the ferroelectric capacitors. In the case of using a PZT material for the ferroelectric layers, an inorganic material such as $SiO_2$, $Ta_2O_5$, $SrTiO_3$, or $MgO$, or an organic material such as a polyimide may be used as the material for the dielectric layer 180. In the case of using an SBT material for the ferroelectric layers 14, an inorganic material such as $SiO_2$, $Ta_2O_5$, $SrTiO_3$, $SrTa_2O_6$, or $SrSnO_3$, or an organic material such as a polyimide may be used as the material for the dielectric layer 180.

The first signal electrodes 12 and the ferroelectric layers 140 are layered in the first regions 24, and the surface-modifying layer 22 and the dielectric layer 180 is layered in the second regions 26 by the steps (1) to (4).

(5) Formation Step of Second Signal Electrode

Figure 24:
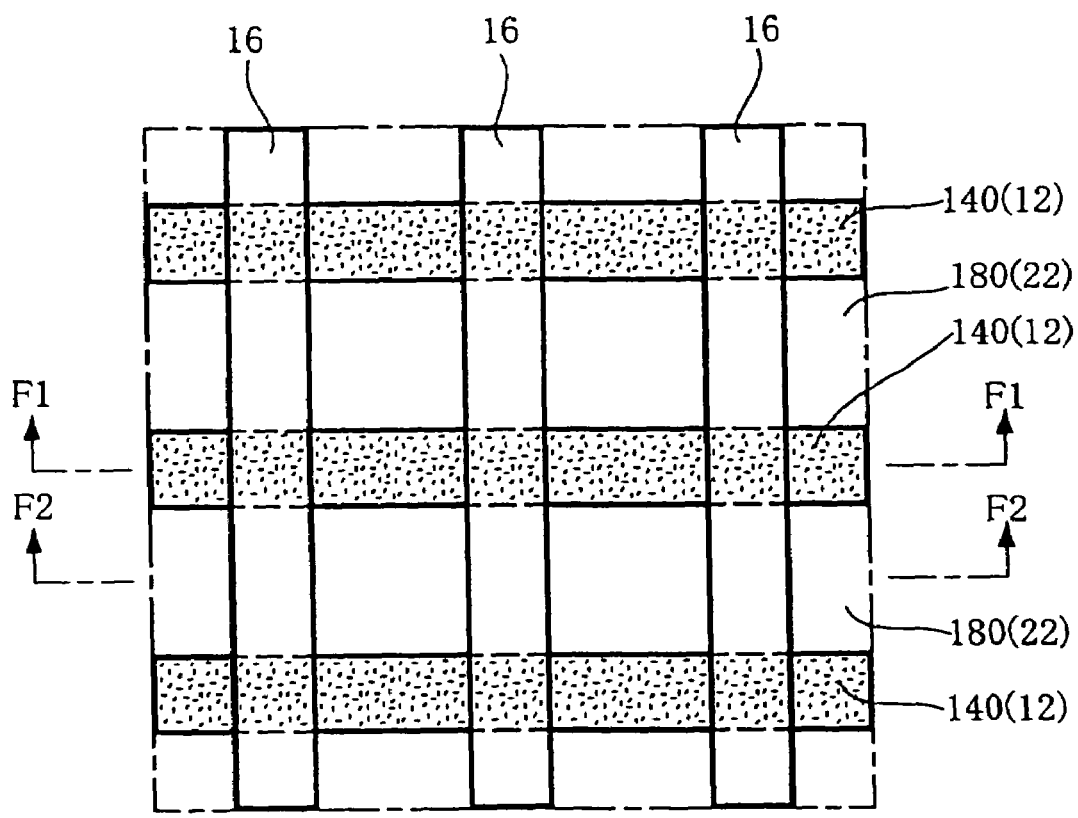
FIG. 24 is a view schematically showing a fabrication step of the memory cell array 200D according to the fourth embodiment.
Figure 25:
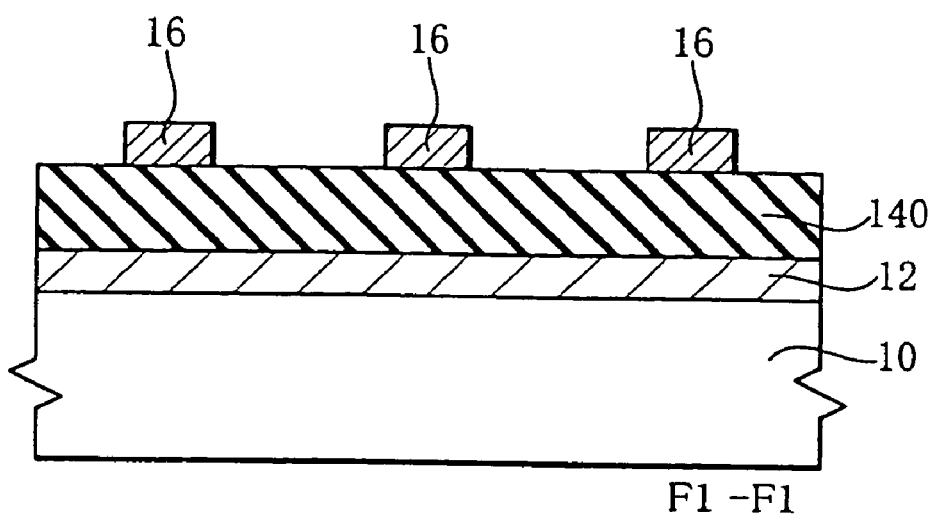
FIG. 25 is a view schematically showing a fabrication step of the memory cell array 200D according to the fourth embodiment.
Figure 26:
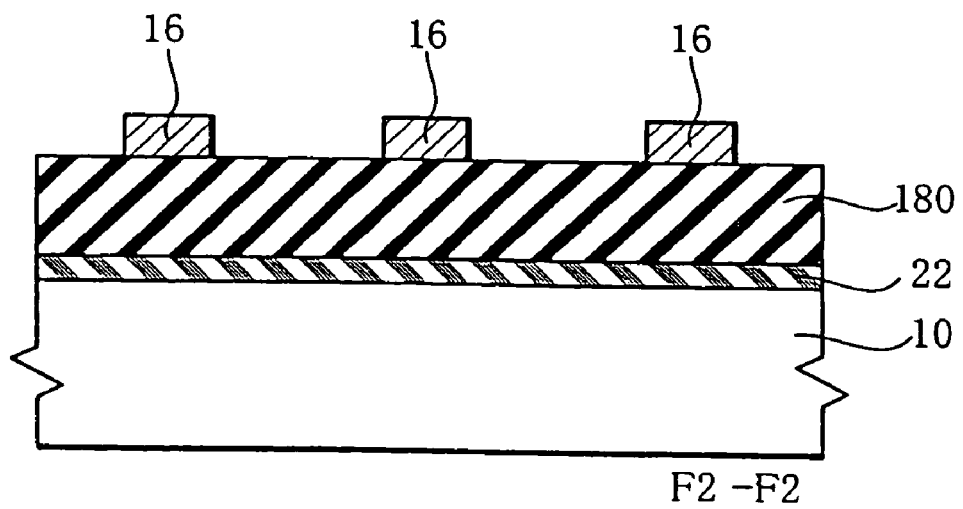
FIG. 26 is a view schematically showing a fabrication step of the memory cell array 200D according to the fourth embodiment.

The second signal electrodes (upper electrodes) 16 with a given pattern are formed on the ferroelectric layers 140 and the dielectric layer 180, as shown in FIGS. 24 to 26. The second signal electrodes 16 are formed by depositing an electrode material for forming the second signal electrodes 16 on the ferroelectric layer 140 and the dielectric layer 180, and patterning the deposited electrode material, for example.

There are no specific limitations to the electrode material insofar as the material has a function of making up part of the ferroelectric capacitors. As the material for forming the ferroelectric layers 140, the material described in the second embodiment may be employed. As the deposition method of the electrode material, sputtering, vacuum deposition, CVD, or the like may be used in the same manner as in the first embodiment. As the patterning method, lithographic technology may be used.

For example, the second signal electrodes 16 may be patterned by forming resist layers (not shown) on the electrode material layer for the second signal electrodes 16 and etching the electrode material layer using the resist layers as masks in the same manner as in the second embodiment.

(6) Patterning Step of Ferroelectric Layer

The ferroelectric layers 140 are patterned by selectively removing the ferroelectric layers 140 using the resist layers (not shown) as masks, as shown in FIGS. 17 and 18. As the method for selectively removing the deposited ferroelectric material, an etching process such as RIE, sputter etching, or plasma etching may be used, in the same manner as in the second embodiment. The resist layers are removed by a conventional method such as dissolving or ashing.

(7) Formation Step of Dielectric Layer

Dielectric layer (not shown) may optionally be formed between the laminates consisting of the ferroelectric layer 14 and the second signal electrode 16 and between the laminates consisting of the surface-modifying layer 22 and the second signal electrode 16. As the formation method of the dielectric layer, the formation method of the dielectric layer 180 in the step (4) may be used.

The memory cell array 200D is formed by these steps. This manufacturing method has the same advantages as in the second embodiment and the third embodiment. Specifically, at least either the first signal electrodes (lower electrodes) or the ferroelectric layers (first signal electrodes 12 and the ferroelectric layer 14 in the present embodiment) can be formed without etching. Therefore, occurrence of a problem relating to readhering substances caused by by-products produced during etching such as in the case of patterning the first signal electrodes using sputter etching can be prevented. Moreover, since the ferroelectric layer 14 is patterned continuously using the resist layers used to pattern the second signal electrodes 16 as masks, the number of fabrication steps can be decreased. Furthermore, since the alignment tolerance for one mask becomes unnecessary in comparison with the case of patterning each layer using different masks, the memory cell array can be highly integrated.

The above examples illustrate a case in which the dielectric layer 18 or 180 is formed in the regions in which the ferroelectric capacitors are not present. However, the present invention is applicable to configurations in which the dielectric layer 18 or 180 is not provided.

The ferroelectric memory device according to the above embodiments may be formed as follows.

The lower electrodes are formed on the base using a CVD process or the like and patterned. The ferroelectric layer is formed on the base including the lower electrodes and patterned. The upper electrodes are formed on the base including the ferroelectric layer and patterned.

Modification Example of Memory Cell Array

Modification examples of the memory cell array are described below with reference to FIGS. 27 to 31.

(1) First Modification Example

Figure 27:
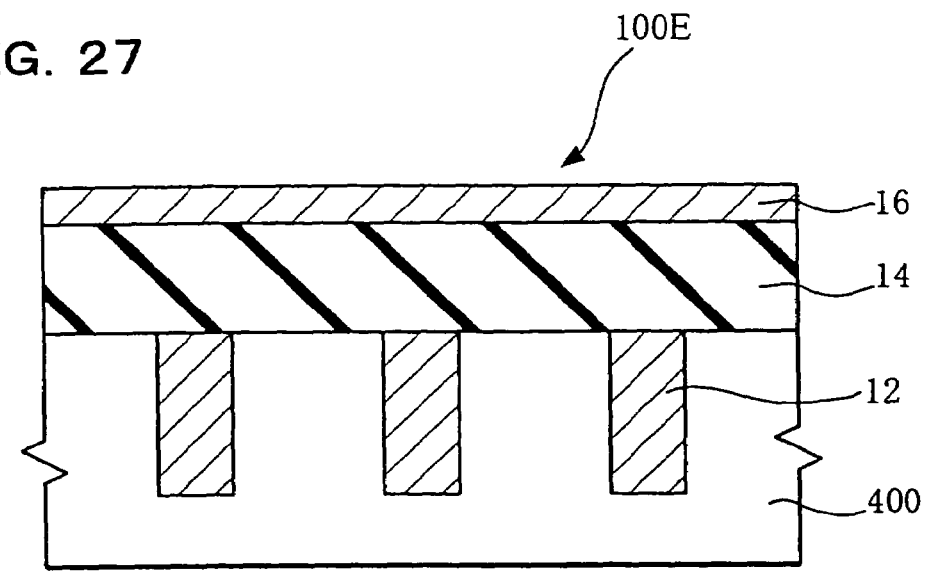
FIG. 27 is a cross-sectional view schematically showing a modification example of the memory cell array.

FIG. 27 is a cross-sectional view showing a portion of a memory cell array 100E. The memory cell array 100E includes an insulating substrate 400, the first signal electrodes 12 provided in grooves formed in the insulating substrate 400, the ferroelectric layer 14, and the second signal electrodes 16. The feature of this example is that the first signal electrodes 12 are formed using a damascene process. For example, the first signal electrodes 12 are formed by forming grooves with a given pattern in the insulating substrate 400 formed of a silicon oxide layer, filling the grooves with a metal such as platinum by plating, and polishing and planarizing the metal layers using a CMP process.

Since the ferroelectric layer 14 can be formed in a state in which no steps are present on the insulating substrate 400 by forming the first signal electrodes using the damascene process, the ferroelectric layer 14 can be easily formed. Moreover, since the resistance of the first signal electrodes 12 can be decreased by increasing the height of the first signal electrodes 12, a high-speed write or read operation can be achieved.

(2) Second Modification Example

Figure 28:
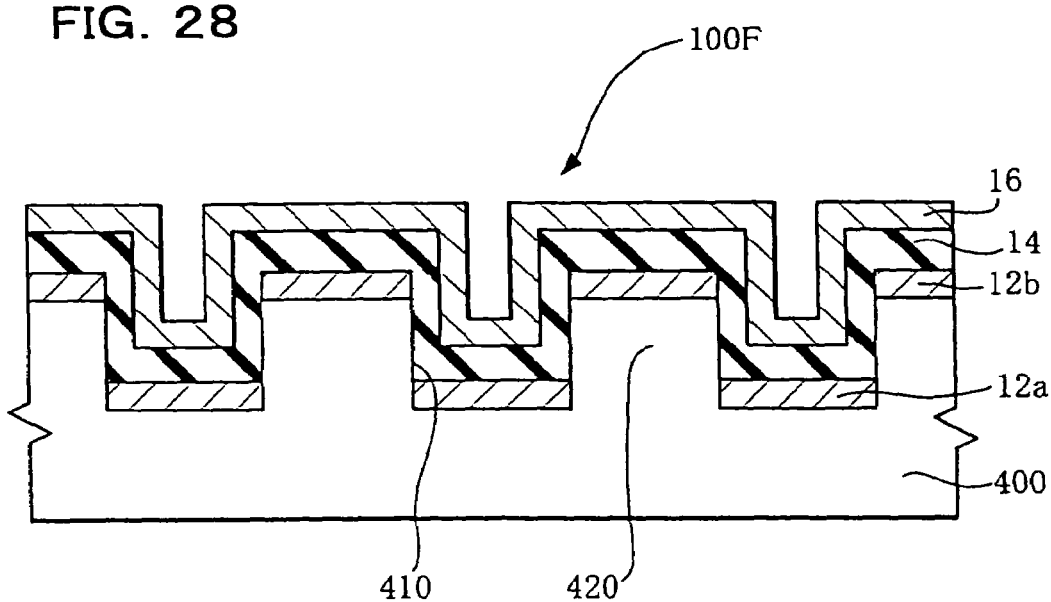
FIG. 28 is a cross-sectional view schematically showing a modification example of the memory cell array.

FIG. 28 is a cross-sectional view showing a portion of a memory cell array 100F. In this example, depressed sections 410 and projected sections 420 with a given pattern are formed on the insulating substrate 400. First signal electrodes 12a and 12b are respectively formed on the bottom of the depressed sections 410 and the upper side of the projected sections 420. The ferroelectric layer 14 is formed on the insulating substrate 400 on which the first signal electrodes 12a and 12b are formed. The second signal electrodes 16 with a given pattern are formed on the ferroelectric layer 14. In the memory cell array 100F having this configuration, since the ferroelectric capacitors are alternately formed up and down in the vertical direction, there is no need to provide a space between the first signal electrode 12a and the first signal electrode 12b adjacent thereto in a plan view. Therefore, the memory cells can be arranged at an extremely high degree of integration.

(3) Third Modification Example

Figure 29:
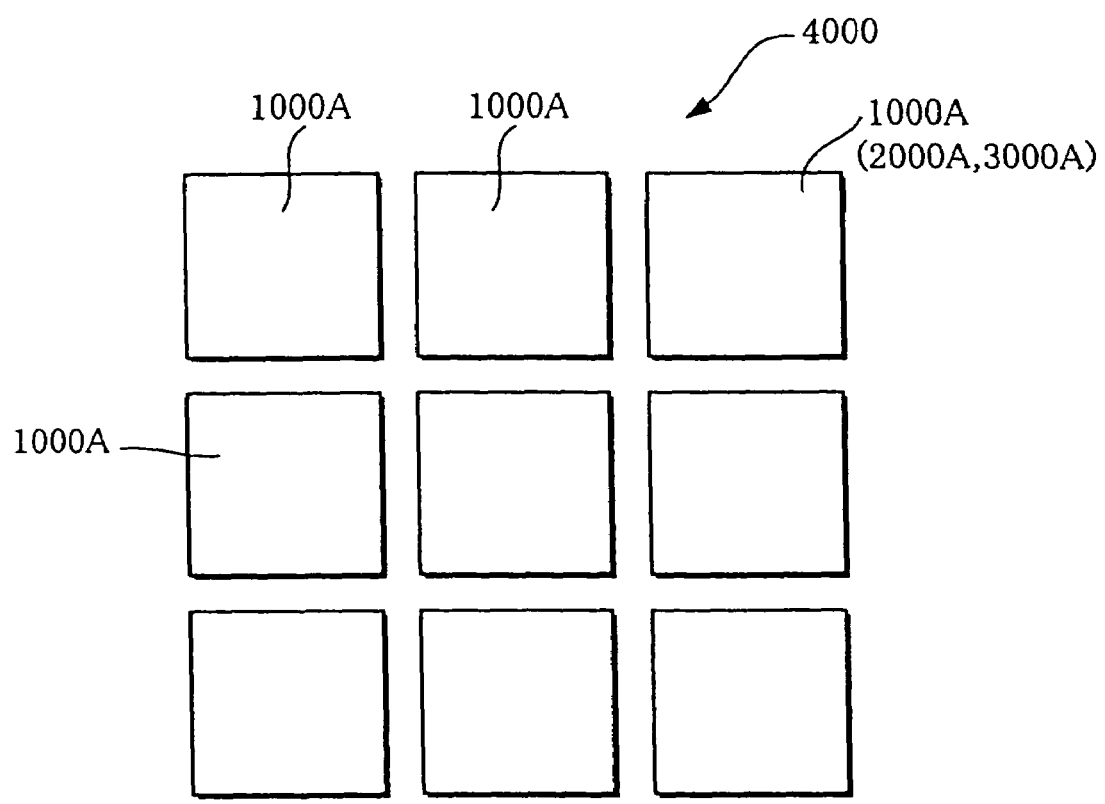
FIG. 29 is a cross-sectional view schematically showing a modification example of the memory cell array.

FIG. 29 is a plan view schematically showing a ferroelectric memory device according to the present embodiment. The feature of this ferroelectric memory device 4000 is that a plurality of unit blocks 1000A consisting of the ferroelectric memory device 1000 according to the first embodiment is arranged. The interconnect length of the signal electrodes can be set to a proper level by arranging the ferroelectric memory devices in a divided state. As a result, a high-speed write or read operation can be achieved. The memory devices 2000 and 3000 according to the second embodiment may be respectively used as unit blocks 2000A and 3000A instead of using the unit blocks 1000A having the same configuration as that of the memory device of the first embodiment.

(4) Fourth Modification Example

Figure 30:
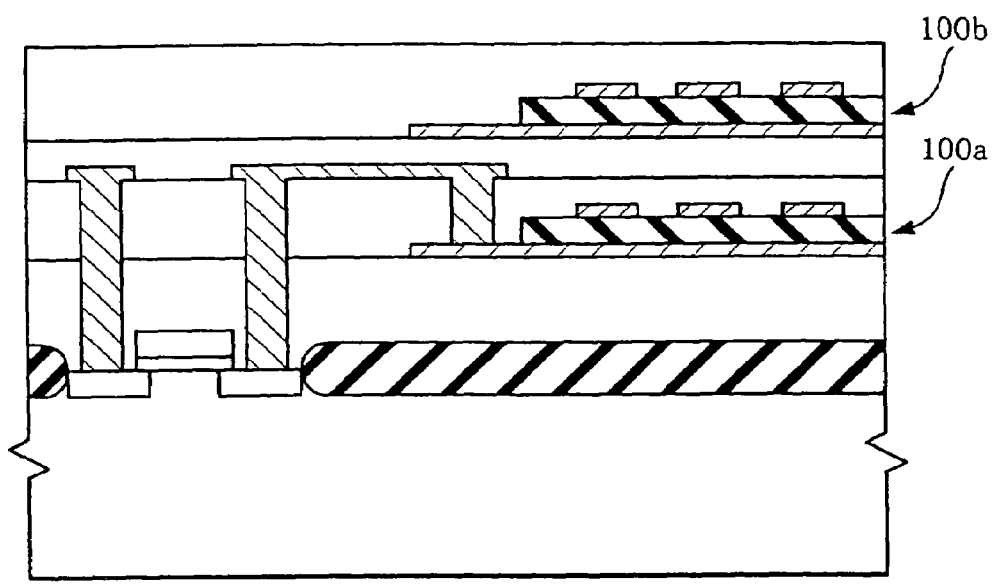
FIG. 30 is a cross-sectional view schematically showing a modification example of the memory cell array.

In the above embodiments, the memory cell array is formed only in one layer. However, the present invention is not limited thereto. The memory cell array may be formed in two or more layers as shown in FIG. 30. Specifically, a plurality of memory cell arrays 100a and 100b may be layered through a protective layer such as an interlayer dielectric.

(5) Fifth Modification Example

Figure 31:
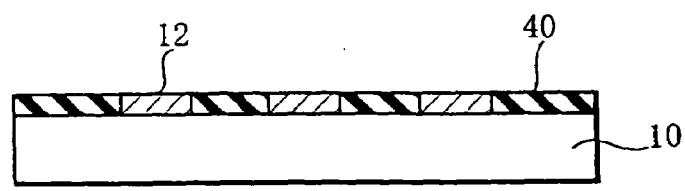
FIG. 31 is a cross-sectional view schematically showing a modification example of the memory cell array.

Insulation layers 40 may be formed between the first signal electrodes 12 so as to have an upper surface at the same level as the upper surface of the first signal electrodes 12, as shown in FIG. 31. In this case, since the ferroelectric layer can be formed on the planar surface, patterning accuracy of the ferroelectric layer can be improved.

As the formation method of the insulation layers, a solution application process can be given. The insulation layers may be formed using a selective growth process. As specific examples of the selective growth process, the methods described in the third and fourth embodiments may be applied.

After forming the insulation layers, the first signal. electrodes may be formed by filling the space between the insulation layers with metal layers. As the method for filling the space with metal layers, a solution application process can be given. As the solution to be used in this process, a solution in which metal micropowder with a diameter of 3 nm (30 Å) is dispersed can be given.

Application Example to Embedded Semiconductor Device

Figure 32:
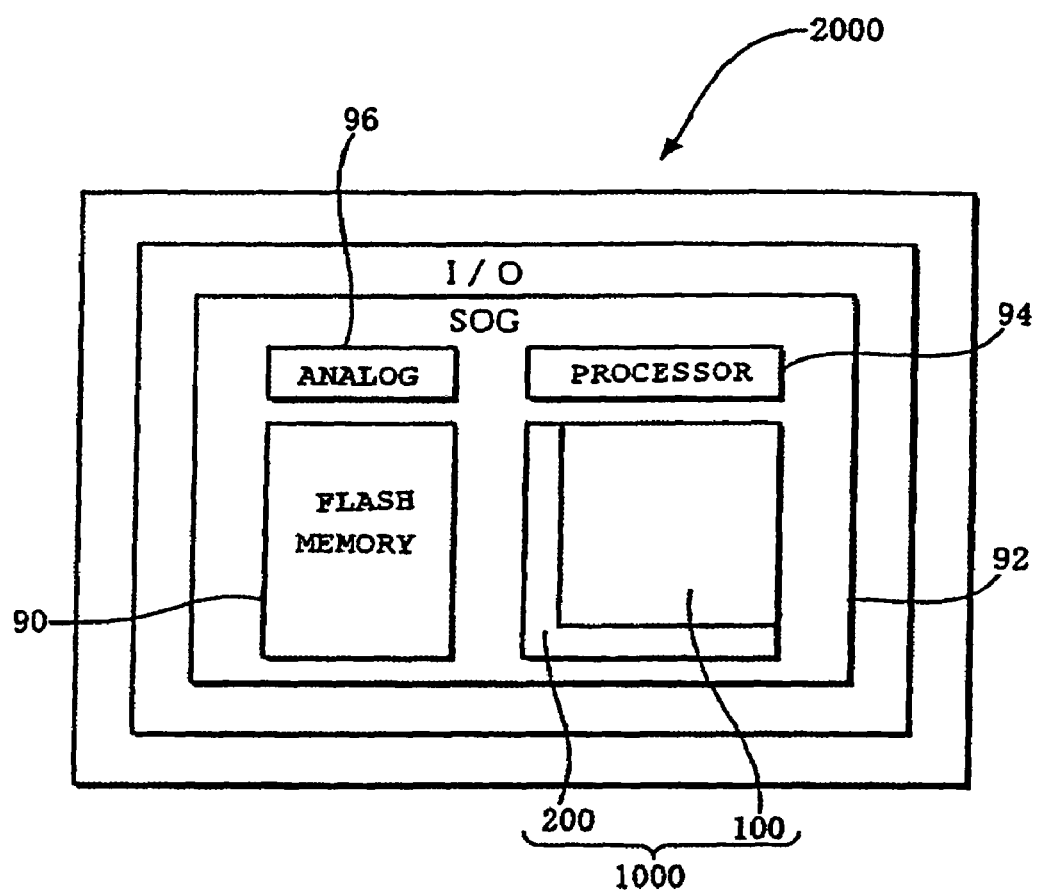
FIG. 32 is a plan view schematically showing an example of an embedded device to which the ferroelectric memory device of the present invention is applied.

FIG. 32 is a view schematically showing a layout of an embedded device to which the ferroelectric memory device of the above embodiment is applied. In this example, an embedded device 2000 includes a flash memory 90, a processor 94, and an analog circuit 96 which are formed on SOG (Sea of Gates) 92. An SRAM may be included in combination.

The present invention is not limited to the above embodiments. Various modifications and variations are possible within the scope of the present invention.

What is claimed is:

1. A method of manufacturing a ferroelectric memory device, comprising the steps of:
   (a) forming a peripheral circuit section for selectively writing information into or reading information from a memory cell over a semiconductor substrate; and
   (b) forming at least first signal electrodes, second signal electrodes arranged in a direction intersecting the first signal electrodes, and a ferroelectric layer disposed at least in intersection regions between the first signal electrodes and the second signal electrodes, and forming a memory cell array in which memory cells are arranged in a matrix,
   wherein the peripheral circuit section is formed in a region outside the memory cell array,
   wherein the step (b) comprises steps of:
   (b-1) forming the first signal electrodes;
   (b-2) forming the ferroelectric layer linearly along the first signal electrodes; and
   (b-3) forming the second signal electrodes.

2. The method of manufacturing a ferroelectric memory device according to claim 1,
   wherein the step (b-2) comprises a step of forming an amorphous ferro electric layer or a microcrystalline ferro electric layer, and a step of forming the ferroelectric layer by subjecting the amorphous ferroelectric layer or the microcrystalline ferroelectric layer to a heat treatment.

3. The method of manufacturing a ferroelectric memory device according to claim 1, further comprising:
   a step of forming, over a base, a first region having a surface characteristic which causes a material for forming at least one of the first signal electrodes or the ferroelectric layer to be deposited preferentially, and a second region having a surface characteristic which causes a material for forming at least one of the first signal electrodes or the ferroelectric layer to be less deposited than the first region; and
   a step of providing a material for forming at least one of the first signal electrodes or the ferroelectric layer and selectively forming the material in the first region.

4. The method of manufacturing a ferroelectric memory device according to claim 3,
   wherein the first region and the second region are formed on a surface of the base.

5. The method of manufacturing a ferroelectric memory device according to claim 4,
wherein a surface of the base is exposed in the first region, and
wherein a surface-modifying layer that has a surface characteristic exhibiting weaker affinity to the material for forming the first signal electrodes and the ferroelectric layer than the exposed surface of the base in the first region is formed in the second region.

6. The method of manufacturing a ferroelectric memory device according to claim 4,
wherein a surface of the base is exposed in the second region, and
wherein a surface-modifying layer that has a surface characteristic exhibiting stronger affinity to the material for forming the first signal electrodes and the ferroelectric layer than the exposed surface of the base in the second region is formed in the first region.

7. The method of manufacturing a ferroelectric memory device according to claim 1,
wherein a dielectric layer is provided between laminates formed of the first signal electrodes and the ferroelectric layer so as to cover exposed areas of the base.

8. The method of manufacturing a ferroelectric memory device according to claim 7,
wherein the dielectric layer is formed of a material having a dielectric constant lower than a dielectric constant of the ferroelectric layer.

9. A method of manufacturing a ferroelectric memory device comprising the steps of,
(a) forming a peripheral circuit section for selectively writing information into or reading information from a memory cell over a semiconductor substrate; and
(b) forming at least first signal electrodes, second signal electrodes arranged in a direction intersecting the first signal electrodes, and a ferroelectric layer disposed at least in intersection regions between the first signal electrodes and the second signal electrodes, and forming a memory cell array in which memory cells are arranged in a matrix,
wherein the peripheral circuit section is formed in a region outside the memory cell array,
wherein the ferroelectric layer and the second signal electrodes are formed in a direction intersecting the first signal electrodes, and
wherein the ferroelectric layer is formed linearly along the second signal electrodes.

10. The method of manufacturing a ferroelectric memory device according to claims 9,
wherein the ferroelectric layer is patterned by etching using a mask and the second signal electrodes are patterned by etching using the same mask.

11. The method of manufacturing a ferroelectric memory device according to claim 9,
wherein a dielectric layer is provided between laminates formed of the ferroelectric layer and the second signal electrode so as to cover exposed areas of the base and the first signal electrodes.

12. The method of manufacturing a ferroelectric memory device according to claim 11,
wherein the dielectric layer is formed of a material having a dielectric constant lower than a dielectric constant of the ferroelectric layer.

13. The method of manufacturing a ferroelectric memory device according to claim 1, further comprising:
a step (b-4) of patterning the ferroelectric layer after the step (b-3), and causing the ferroelectric layer to remain in a shape of a block only in intersecting regions between the first signal electrodes and the second signal electrodes.

14. The method of manufacturing a ferroelectric memory device according to claim 13, further comprising:
a step of forming, over the base, a first region having a surface characteristic which causes a material for forming at least one of the first signal electrodes or the ferroelectric layer to be deposited preferentially, and a second region having a surface characteristic which causes a material for forming at least one of the first signal electrodes or the ferroelectric layer to be less deposited than the first region; and
a step of providing a material for forming at least one of the first signal electrodes or the ferroelectric layer and selectively forming the material in the first region.

15. The method of manufacturing a ferroelectric memory device according to claim 14,
wherein the first region and the second region are formed on a surface of the base.

16. The method of manufacturing a ferroelectric memory device according to claim 15,
wherein a surface of the base is exposed in the first region, and
wherein a surface-modifying layer that has a surface characteristic exhibiting weaker affinity to the material for forming the first signal electrodes and the ferroelectric layer than the exposed surface of the base in the first region is formed in the second region.

17. The method of manufacturing a ferroelectric memory device according to claim 15,
wherein a surface of the base is exposed in the second region, and
wherein a surface-modifying layer that has a surface characteristic exhibiting stronger affinity to the material for forming the first signal electrodes and the ferroelectric layer than the exposed surface of the base in the second region is formed in the first region.

18. The method of manufacturing a ferroelectric memory device according to claims 13,
wherein the ferroelectric layer is patterned by etching using a mask and the second signal electrodes are patterned by etching using the same mask.

19. The method of manufacturing a ferroelectric memory device according to claim 13,
wherein a dielectric layer is provided between laminates formed of the first signal electrodes and the ferroelectric layer so as to cover exposed areas of the base.

20. The method of manufacturing a ferroelectric memory device according to claim 19,
wherein a dielectric layer is provided between laminates formed of the ferroelectric layer and the second signal electrode so as to cover exposed areas of the base and the first signal electrodes.

21. The method of manufacturing a ferroelectric memory device according to claim 19,
wherein the dielectric layer is formed of a material having a dielectric constant lower than a dielectric constant of the ferroelectric layer.

22. The method of manufacturing a ferroelectric memory device according to claim 1, further comprising:
a step (b-5) of forming insulation layers between the first signal electrodes after the step (b-1), wherein upper surfaces of the insulation layers are on the same level as upper surfaces of the first signal electrodes.

23. The method of manufacturing a ferroelectric memory device according to claim 22,
wherein the step (b-5) is a step of forming the insulation layers using a solution application process and planarizing the insulation layers.

24. An embedded device comprising:

the ferroelectric memory device as defined in claim 1; and at least one component selected from a group including a flash memory, a processor, an analog circuit, and an SRAM.

* * * * *